(12) United States Patent
Huang et al.

(10) Patent No.: US 12,406,952 B2
(45) Date of Patent: Sep. 2, 2025

(54) CHIP STRUCTURE WITH CONDUCTIVE LAYER

(71) Applicant: TAIWAN SEMICONDUCTOR MANUFACTURING COMPANY, LTD., Hsinchu (TW)

(72) Inventors: Chih-Fan Huang, Kaohsiung (TW); Mao-Nan Wang, Kaohsiung (TW); Hui-Chi Chen, Zhudong Township, Hsinchu County (TW); Dian-Hau Chen, Hsinchu (TW); Yen-Ming Chen, Chu-Pei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/753,052

(22) Filed: Jun. 25, 2024

(65) Prior Publication Data

US 2024/0347488 A1    Oct. 17, 2024

Related U.S. Application Data

(60) Continuation of application No. 17/874,036, filed on Jul. 26, 2022, now Pat. No. 12,057,419, which is a division of application No. 16/655,998, filed on Oct. 17, 2019, now Pat. No. 11,437,331.

(51) Int. Cl.
*H01L 23/00* (2006.01)

(52) U.S. Cl.
CPC ............. *H01L 24/05* (2013.01); *H01L 24/03* (2013.01); *H01L 24/13* (2013.01); *H01L 2224/02311* (2013.01); *H01L 2224/02313* (2013.01); *H01L 2224/02331* (2013.01); *H01L 2224/03462* (2013.01); *H01L 2224/0401* (2013.01); *H01L 2224/05548* (2013.01); *H01L 2224/13016* (2013.01)

(58) Field of Classification Search
None
See application file for complete search history.

(56) References Cited

U.S. PATENT DOCUMENTS

| | | | |
|---|---|---|---|
| 7,087,977 B2 | 8/2006 | Nakayama et al. |
| 7,202,567 B2 | 4/2007 | Kikuta et al. |
| 7,280,024 B2 | 10/2007 | Braunisch |
| 7,750,434 B2 | 7/2010 | Imaoka et al. |
| 8,110,895 B2 | 2/2012 | Imaoka et al. |
| 8,222,714 B2 | 7/2012 | Shi et al. |

(Continued)

*Primary Examiner* — Nishath Yasmeen
(74) *Attorney, Agent, or Firm* — Birch, Stewart, Kolasch & Birch, LLP

(57) ABSTRACT

A chip structure is provided. The chip structure includes a semiconductor substrate. The chip structure includes a first conductive layer over the first dielectric layer. The chip structure includes a conductive via passing through the first conductive layer and electrically connected to the first conductive layer. The chip structure includes a conductive pad over and in direct contact with the conductive via. The chip structure includes a second conductive layer over and spaced apart from the first conductive layer. The chip structure includes a first dielectric layer conformally covering a second lower portion of a sidewall of the second conductive layer. The chip structure includes a third conductive layer over the first dielectric layer.

20 Claims, 41 Drawing Sheets

(56) References Cited

U.S. PATENT DOCUMENTS

| | | | |
|---|---|---|---|
| 9,368,392 B2 * | 6/2016 | Tseng | H01L 21/76802 |
| 9,391,016 B2 | 7/2016 | Shen et al. | |
| 9,502,489 B2 | 11/2016 | Funaya et al. | |
| 9,716,056 B2 | 7/2017 | Leobandung | |
| 10,290,701 B1 * | 5/2019 | Chang | H10D 1/696 |
| 10,446,483 B2 | 10/2019 | Gu et al. | |
| 10,483,344 B1 | 11/2019 | Rubin et al. | |
| 2002/0005565 A1 | 1/2002 | Forbes et al. | |
| 2007/0114651 A1 | 5/2007 | Marimuthu et al. | |
| 2008/0245880 A1 | 10/2008 | Yamazaki | |
| 2009/0082691 A1 | 3/2009 | Denison et al. | |
| 2010/0073122 A1 | 3/2010 | Le Neel et al. | |
| 2010/0224960 A1 * | 9/2010 | Fischer | H01L 23/5223 257/532 |
| 2013/0270675 A1 * | 10/2013 | Childs | H10D 1/692 257/532 |
| 2014/0159200 A1 | 6/2014 | Loke et al. | |
| 2014/0184381 A1 | 7/2014 | Hao et al. | |
| 2015/0289360 A1 | 10/2015 | Leong et al. | |
| 2015/0294936 A1 | 10/2015 | Shen et al. | |
| 2019/0013269 A1 | 1/2019 | Zhang et al. | |
| 2019/0031269 A1 | 1/2019 | Shang | |
| 2019/0148072 A1 * | 5/2019 | Fox, III | H01G 4/005 361/301.4 |
| 2019/0165188 A1 | 5/2019 | Chang et al. | |
| 2019/0221515 A1 | 7/2019 | Gu et al. | |
| 2019/0305078 A1 | 10/2019 | Wu et al. | |

\* cited by examiner

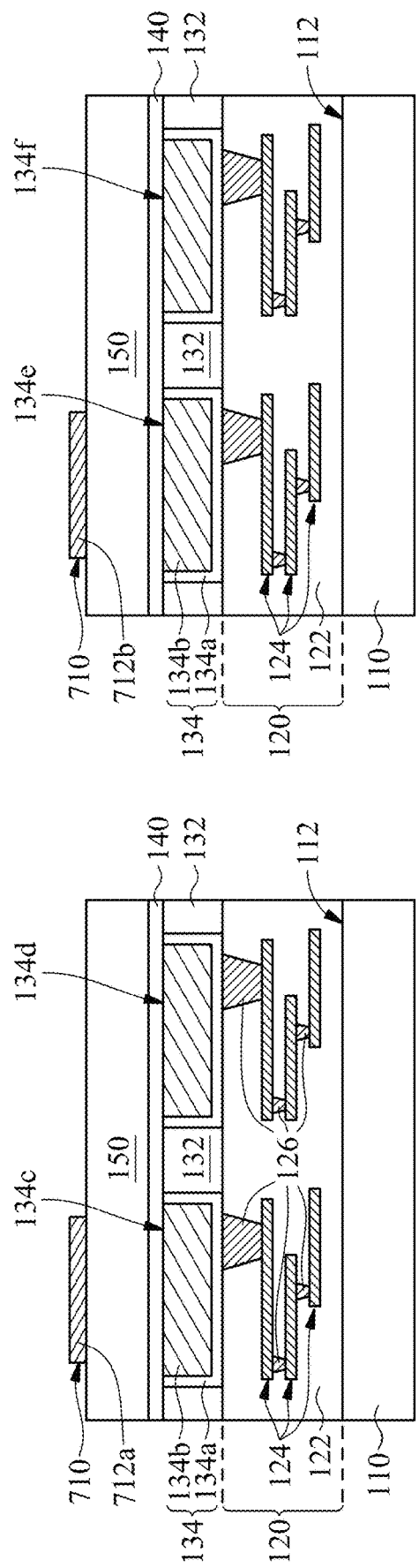

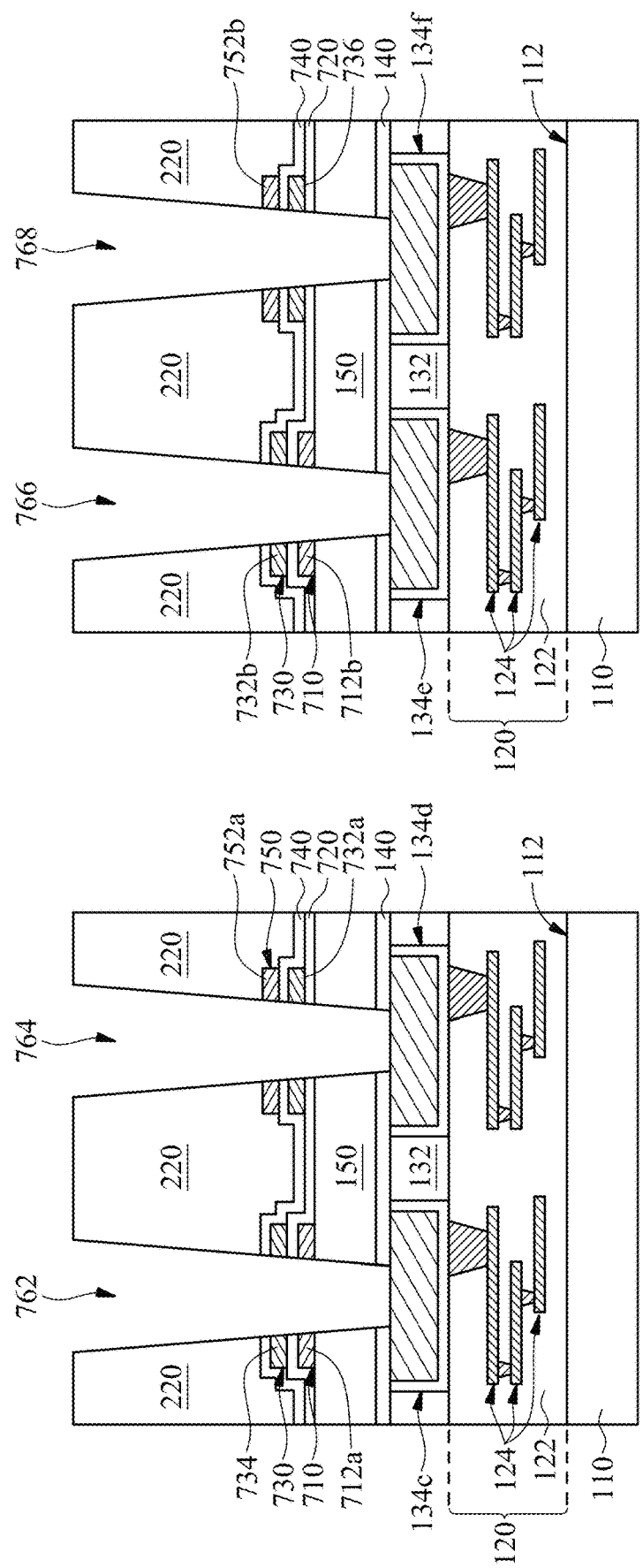

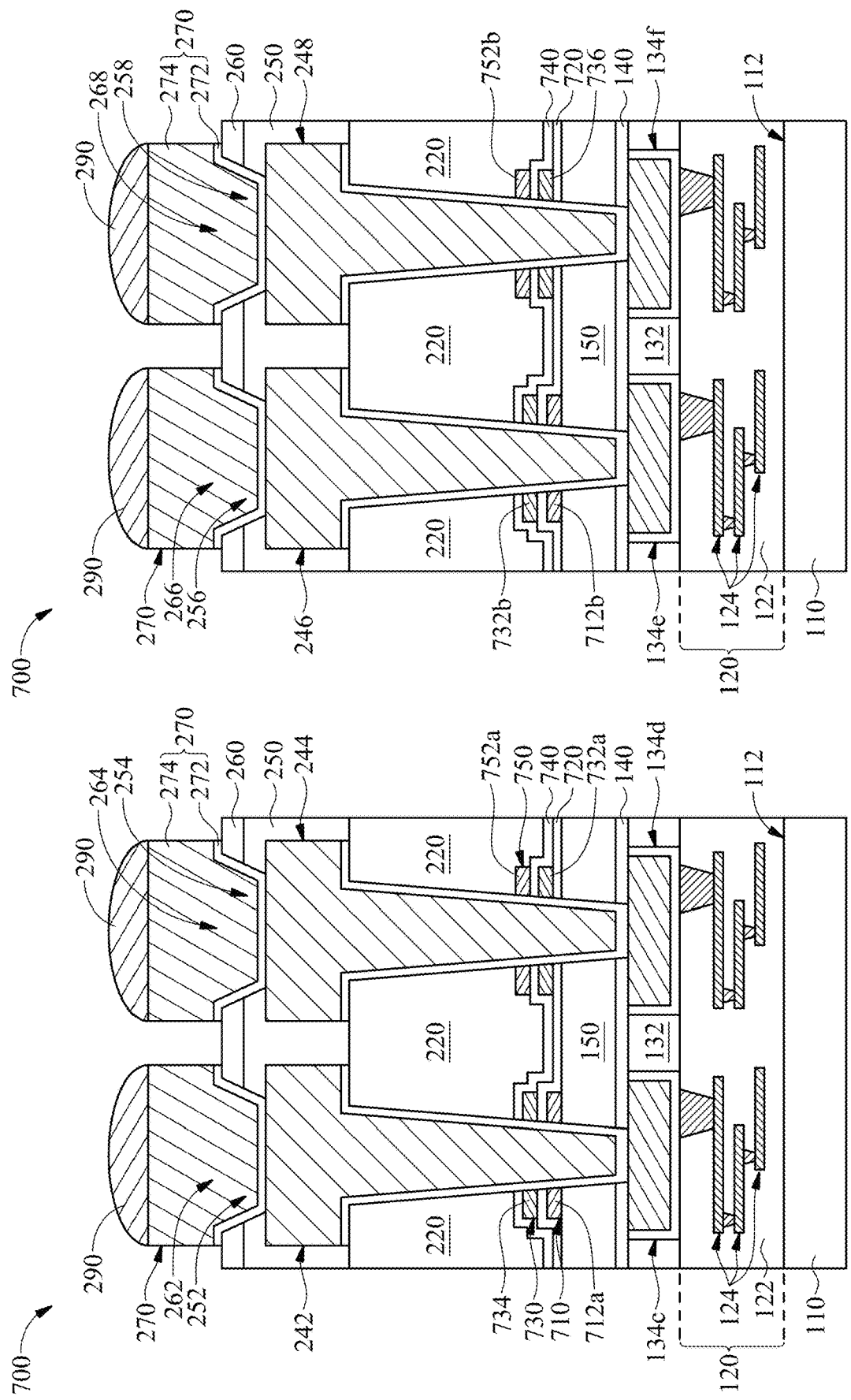

CHIP STRUCTURE WITH CONDUCTIVE LAYER

CROSS REFERENCE

This application is a Continuation of U.S. application Ser. No. 17/874,036, filed on Jul. 26, 2022, which is a Divisional of U.S. application Ser. No. 16/655,998, filed on Oct. 17, 2019, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-2 to FIG. 1C-2 and FIG. 1E-2 to FIG. 1F-2 are top views illustrating the chip structure in FIG. 1A-1 to FIG. 1C-1 and FIG. 1E-1 to FIG. 1F-1, in accordance with some embodiments.

FIG. 3A-1 to FIG. 3F-1 are cross-sectional views of various stages of a process for forming a chip structure, in accordance with some embodiments.

FIG. 3A-2 to FIG. 3E-2 are top views illustrating the chip structure in FIG. 3A-1 to FIG. 3E-1, in accordance with some embodiments.

FIG. 7A-1 to FIG. 7F-1 are top views of various stages of a process for forming a chip structure, in accordance with some embodiments.

FIG. 7A-2 to FIG. 7F-2 are cross-sectional views illustrating the chip structure along a sectional line I-I in FIG. 7A-1 to FIG. 7F-1, in accordance with some embodiments.

FIG. 7A-3 to FIG. 7F-3 are cross-sectional views illustrating the chip structure along a sectional line II-II in FIG. 7A-1 to FIG. 7F-1, in accordance with some embodiments.

DETAILED DESCRIPTION

Figures 1, 1A:
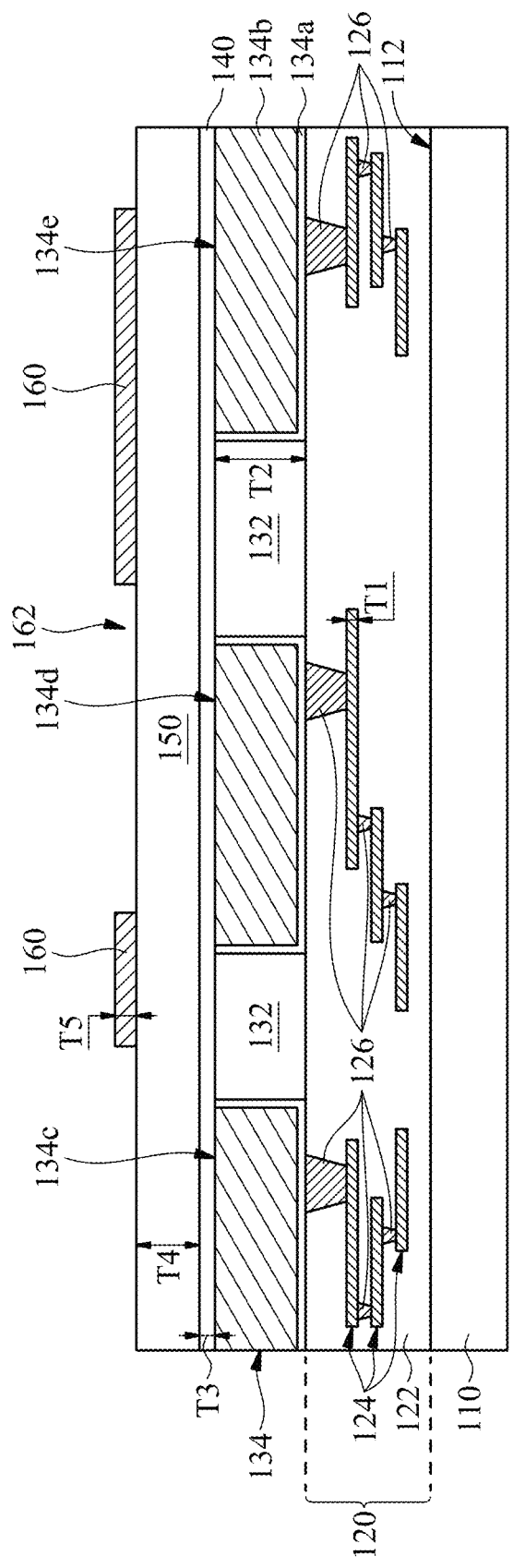
FIG. 1A-1 to FIG. 1H-1 are cross-sectional views of various stages of a process for forming a chip structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the chip structure. Some of the features described below can be replaced or eliminated for different embodiments. Although some embodiments are discussed with operations performed in a particular order, these operations may be performed in another logical order.

Figures 1, 1A, 2:
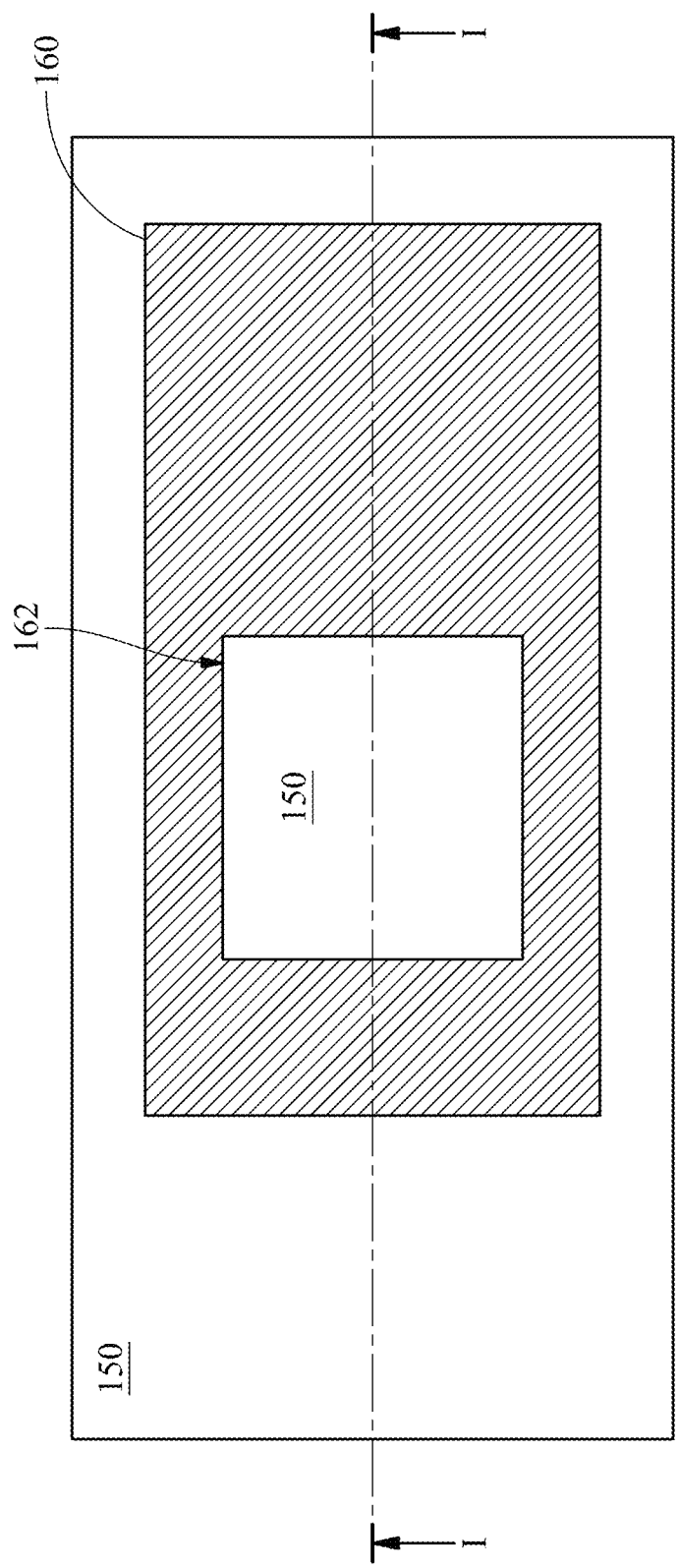
Figures 1, 1B:
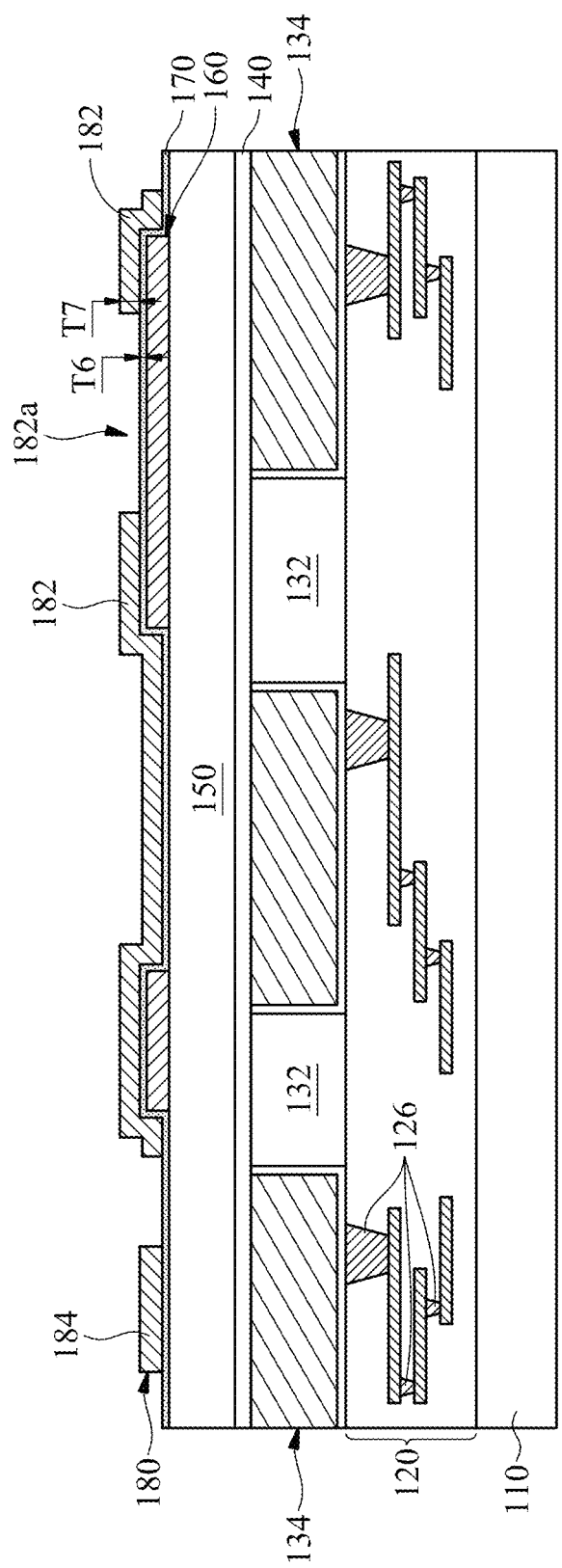
Figures 1, 1B, 2:
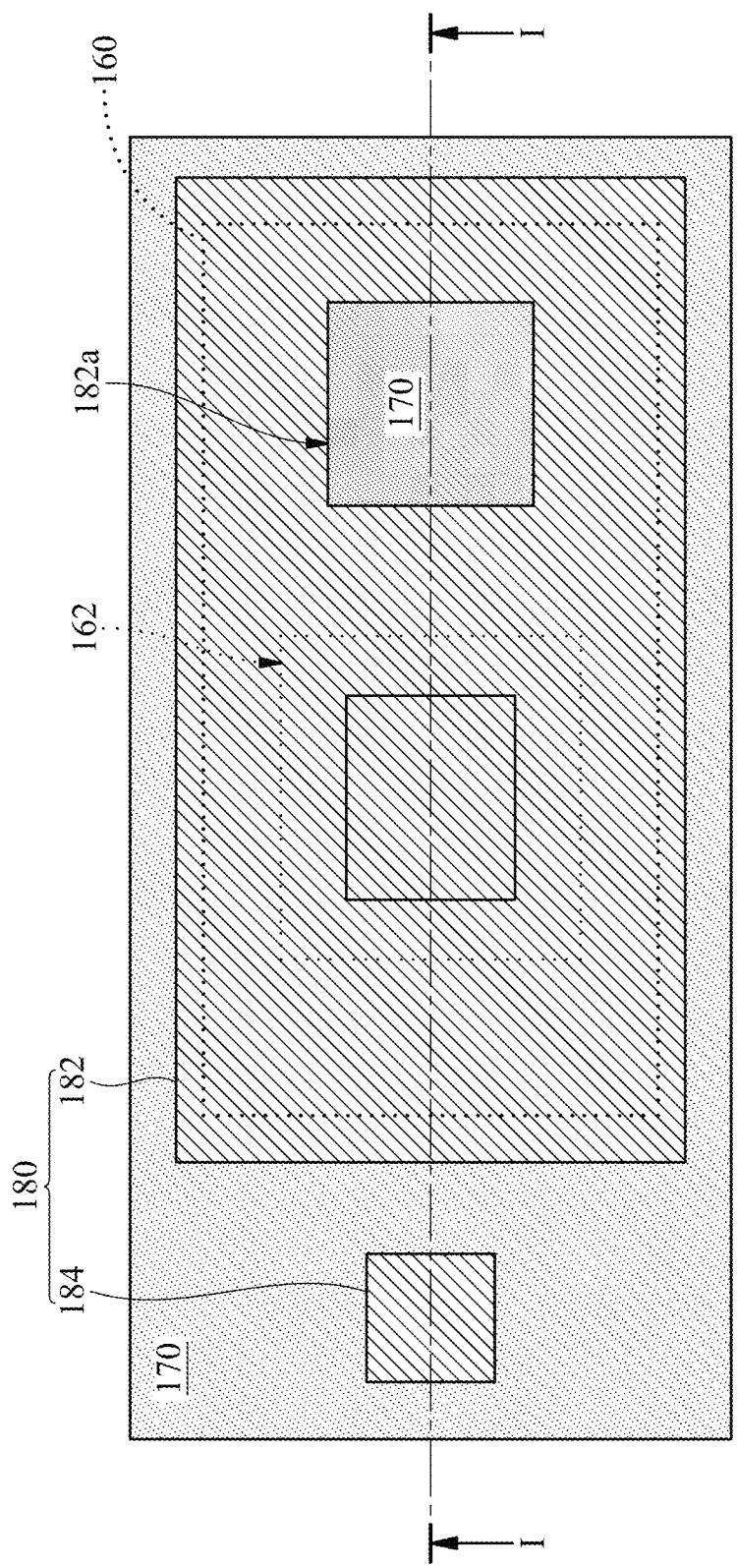
Figures 1, 1C:
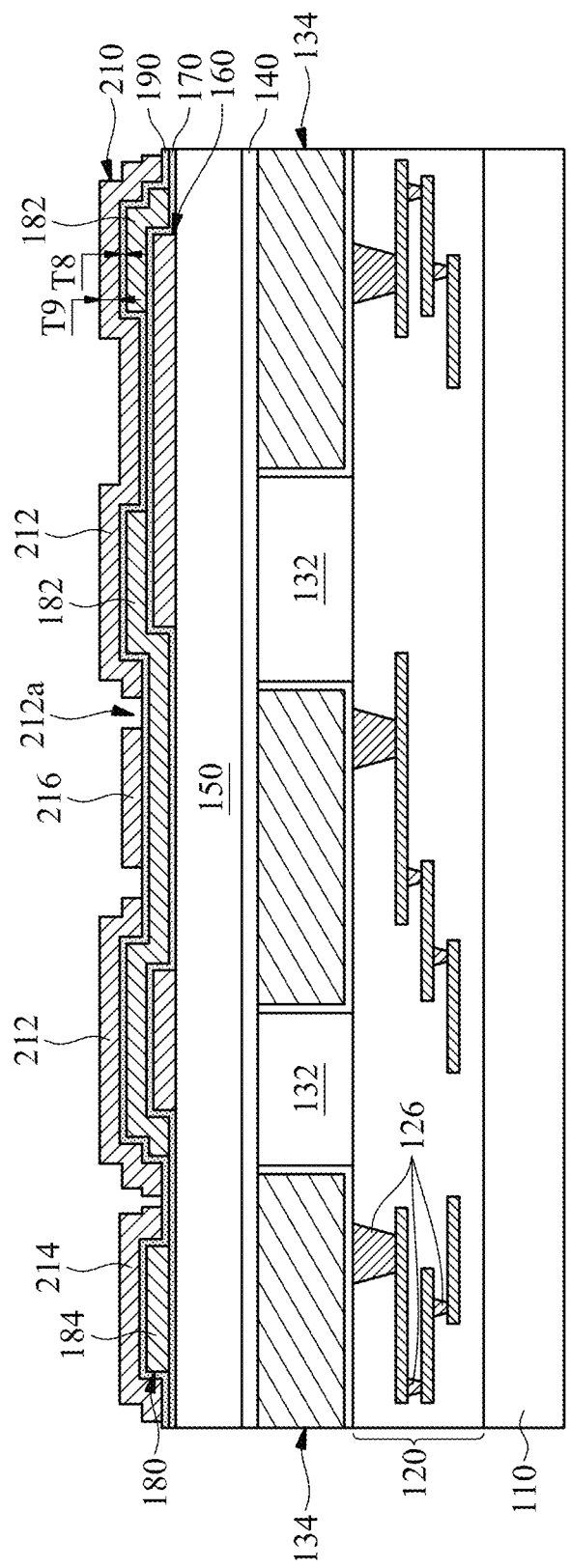
Figures 1, 1C, 2:
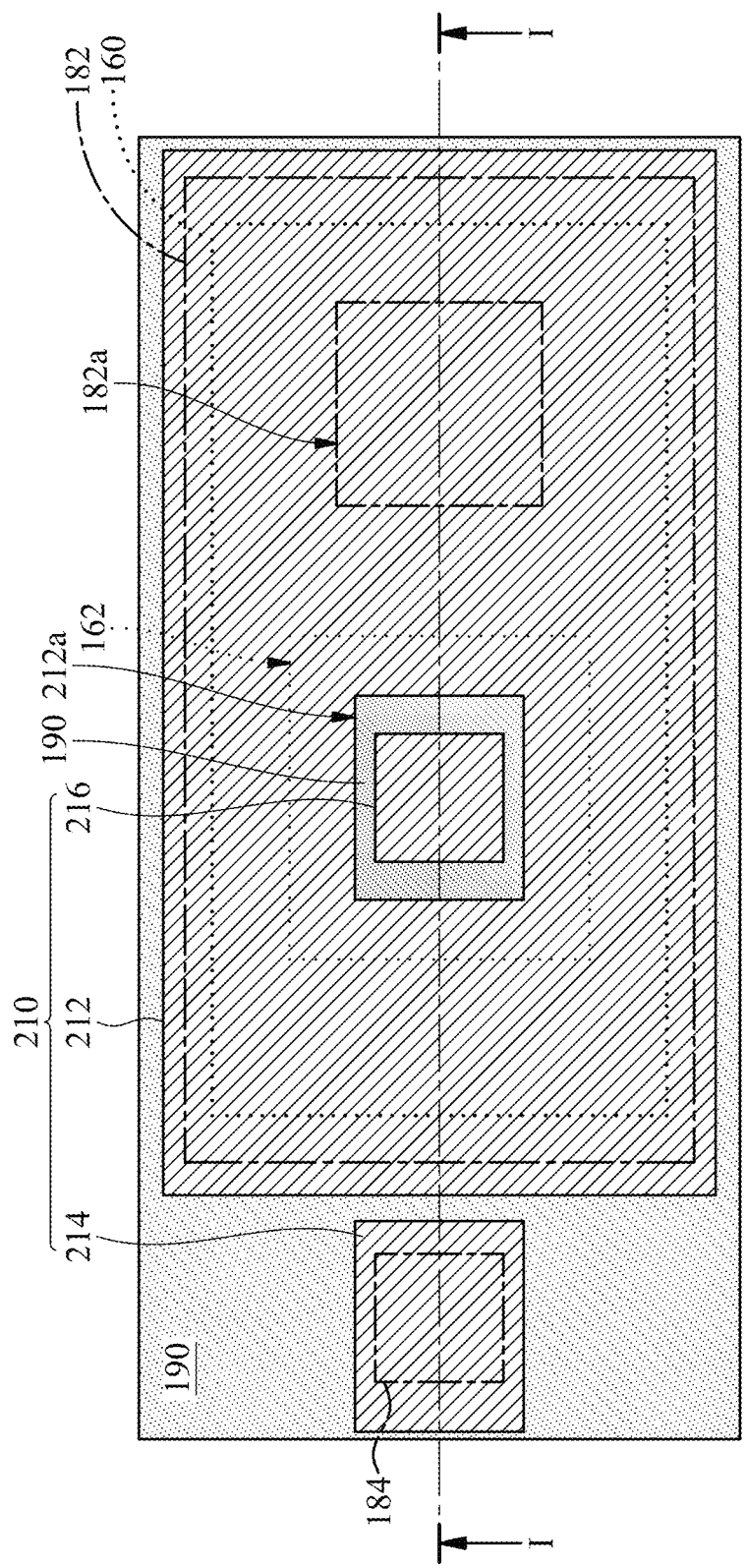
Figures 1, 1D:
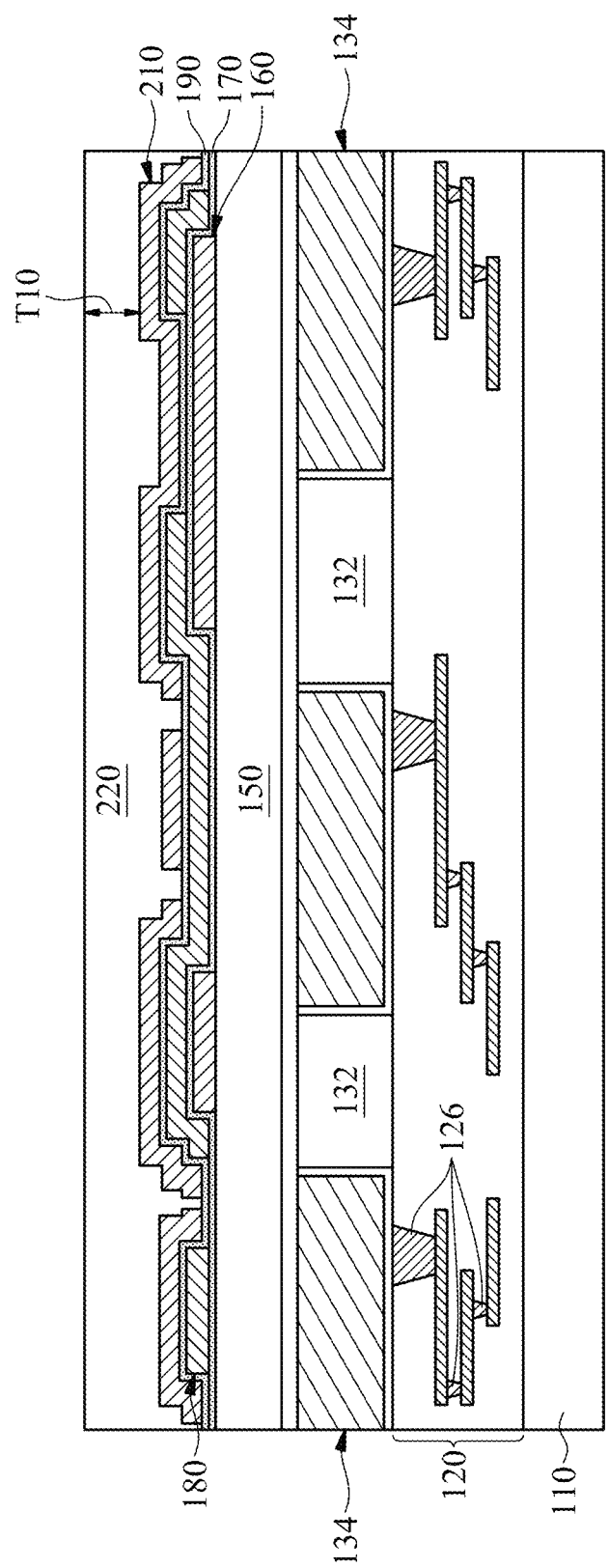
Figures 1, 1E:
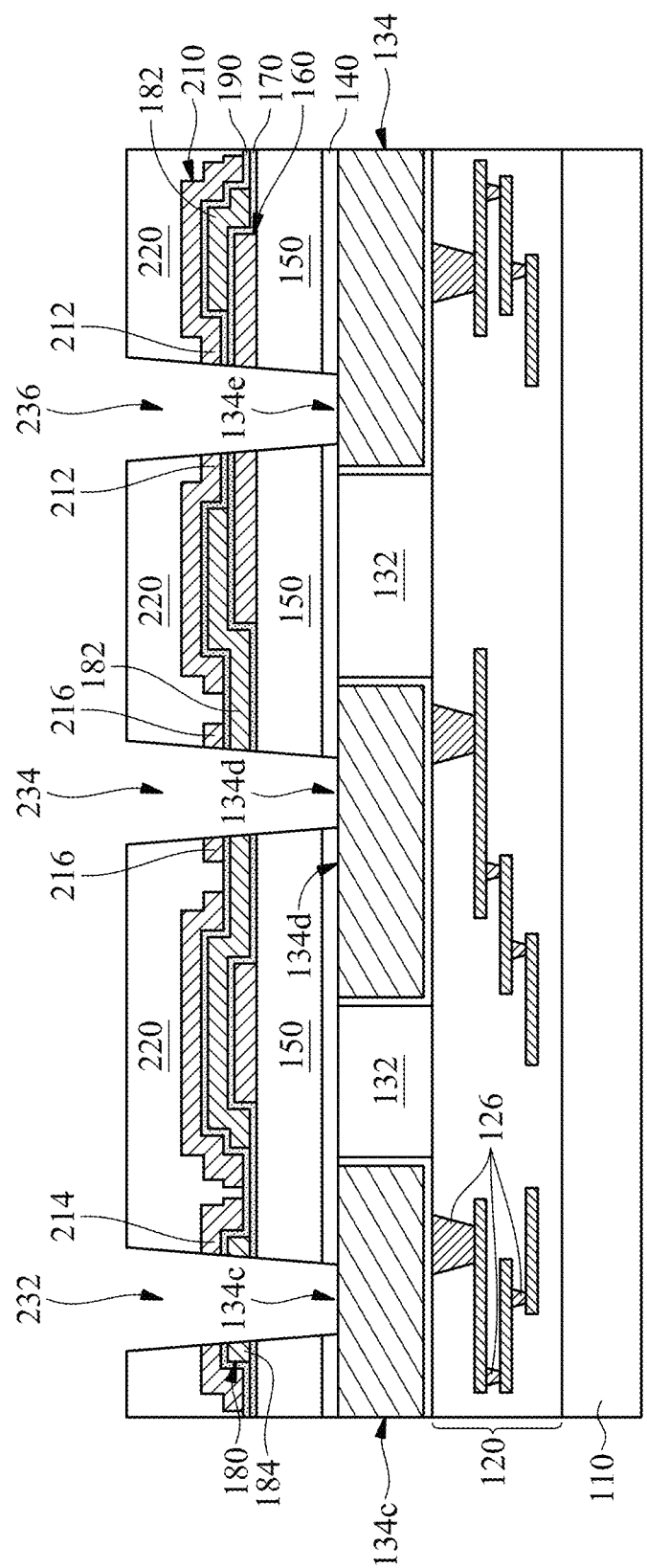
Figures 1, 1E, 2:
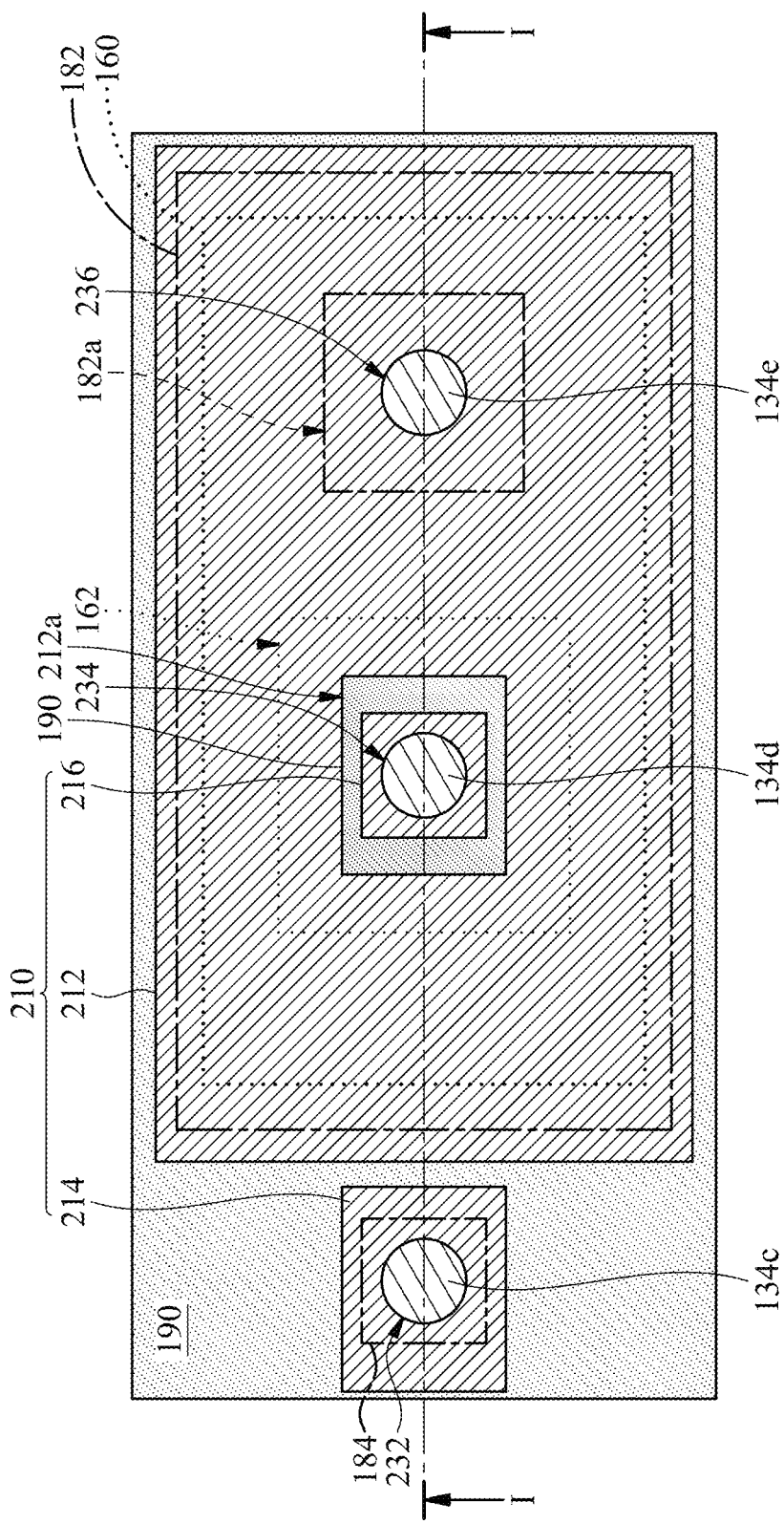
Figures 1, 1F:
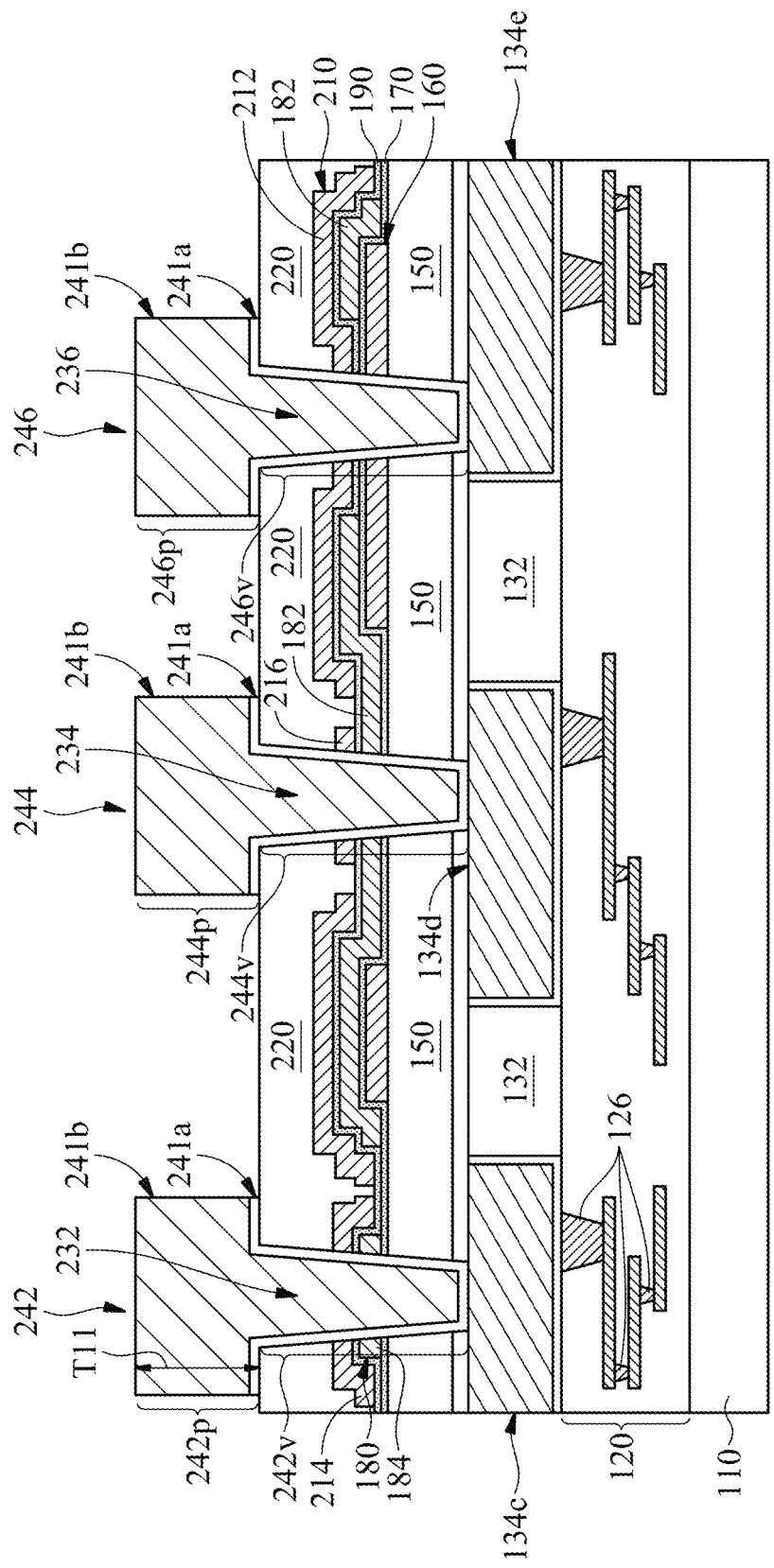
Figures 1, 1F, 2:
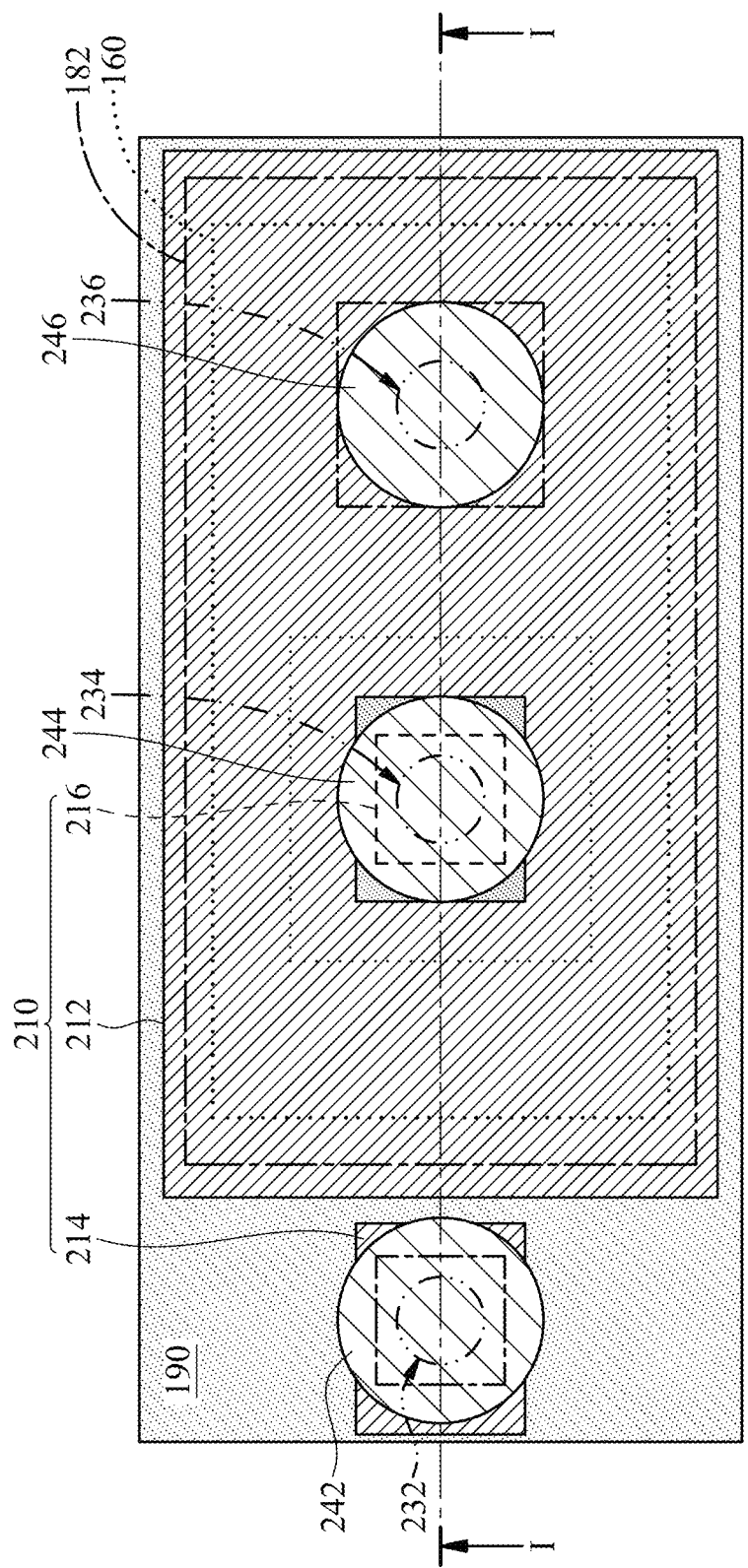
Figures 1, 1G:
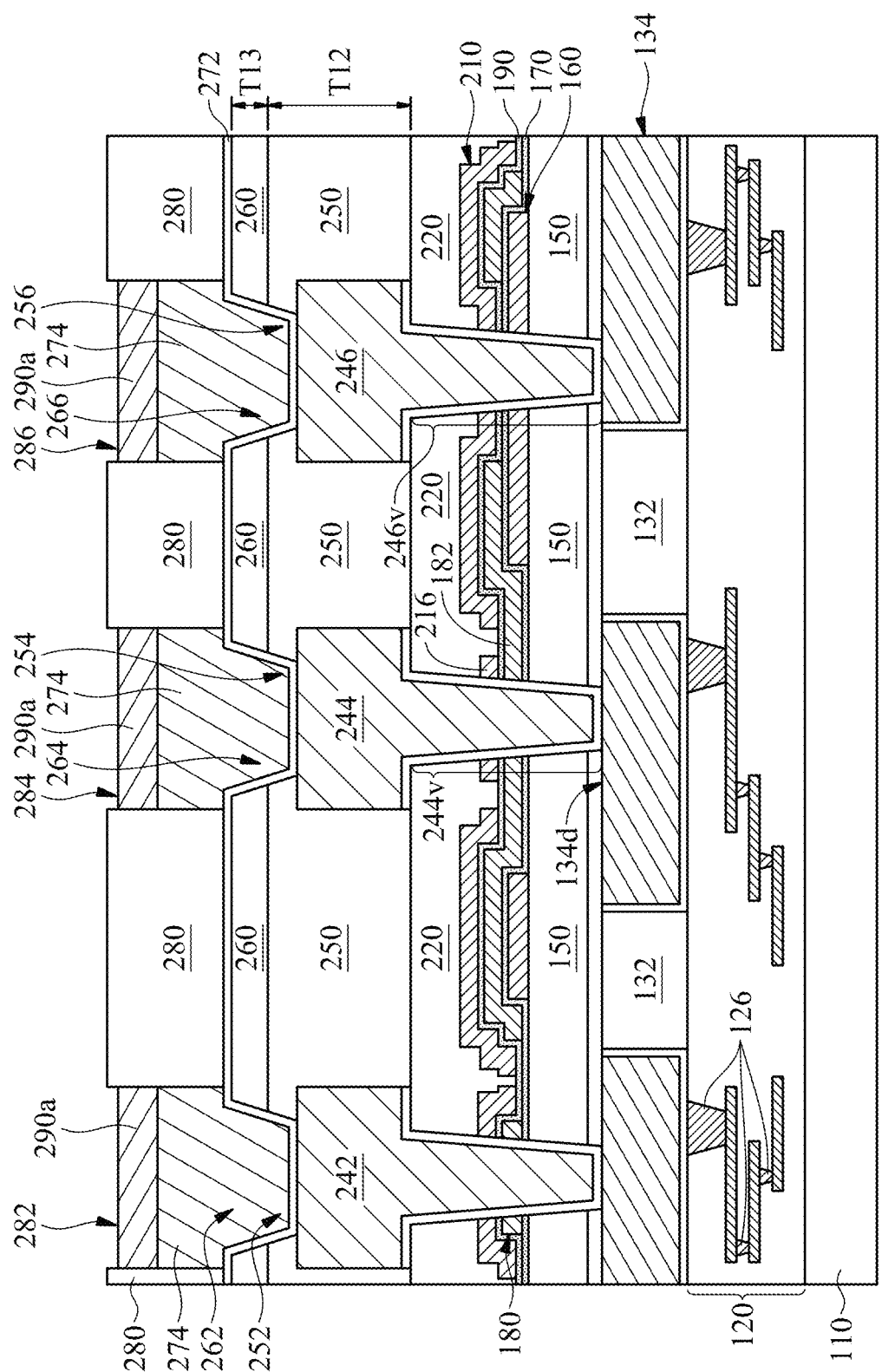
Figures 1, 1H:
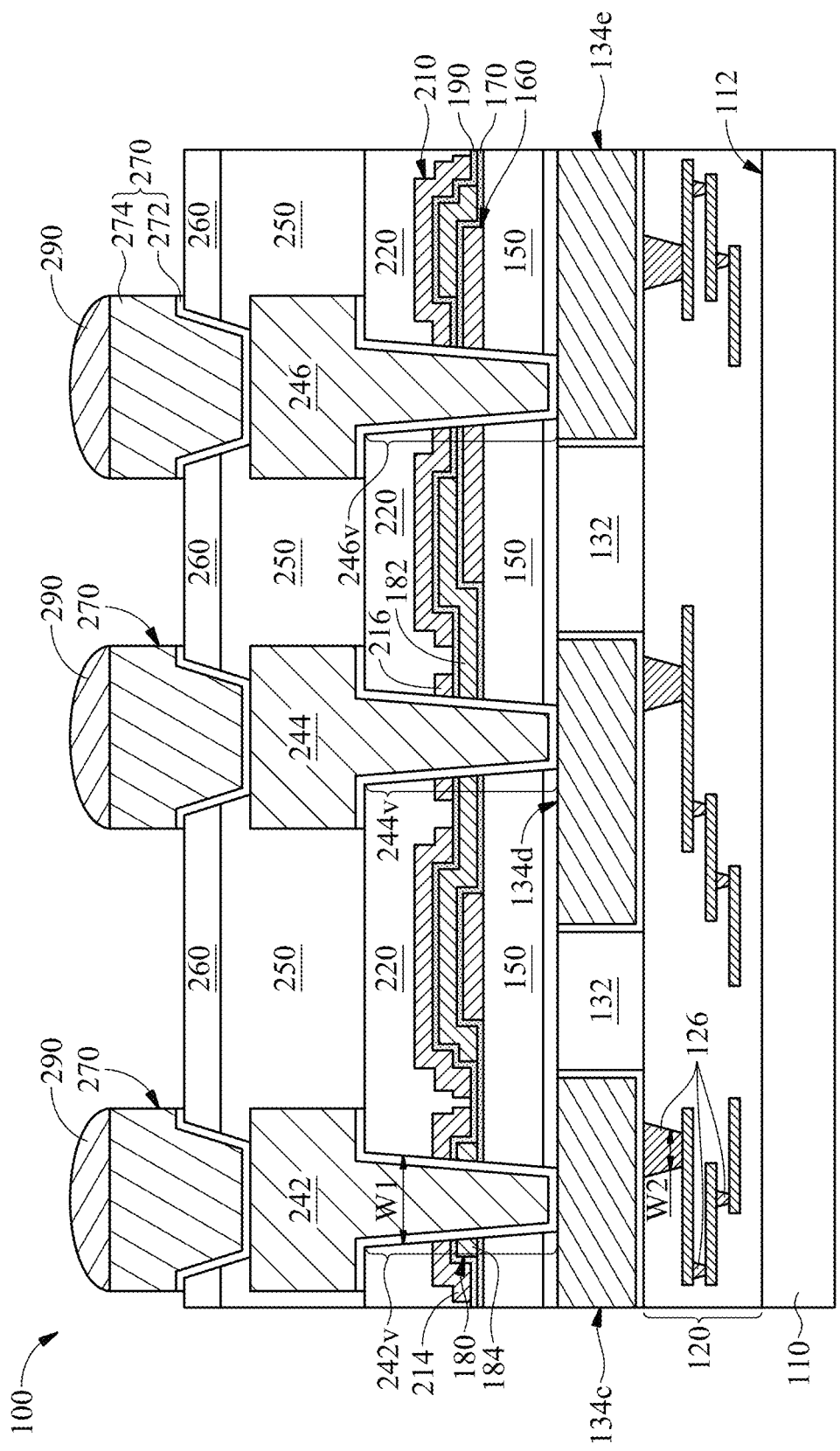

FIG. 1A-1 to FIG. 1H-1 are cross-sectional views of various stages of a process for forming a chip structure, in accordance with some embodiments. FIG. 1A-2 to FIG. 1C-2 and FIG. 1E-2 to FIG. 1F-2 are top views illustrating the chip structure in FIG. 1A-1 to FIG. 1C-1 and FIG. 1E-1 to FIG. 1F-1, in accordance with some embodiments.

As shown in FIG. 1A-1, a substrate 110 is provided, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface 112 of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A-1, an interconnect structure 120 is formed over the substrate 110, in accordance with some embodiments. The interconnect structure 120 includes a dielectric structure 122, wiring layers 124, and conductive vias 126, in accordance with some embodiments. The dielectric structure 122 may include dielectric layers (not shown) stacked over the substrate 110, in accordance with some embodiments.

The wiring layers 124 and the conductive vias 126 are in the dielectric structure 122, in accordance with some embodiments. The wiring layers 124 are spaced apart from each other, in accordance with some embodiments. The wiring layers 124 has a thickness T1 ranging from about 1000 Å to about 4000 Å, in accordance with some embodiments. The conductive vias 126 are electrically connected between different wiring layers 124 and between the wiring layer 124 and the device elements (not shown) formed at the surface 112 of the substrate 110, in accordance with some embodiments.

The dielectric structure 122 is made of an insulating material, such as oxides (e.g., silicon oxide), nitrides (e.g., silicon nitride or silicon oxynitride), silicon carbide, un-doped silicate glass (USG), or a low-k dielectric material with a k-value lower than that of silicon oxide, in accordance with some embodiments. The wiring layers 124 and the conductive vias 126 are made of metal (e.g., copper, aluminum, gold, silver, or tungsten) or alloy thereof, in accordance with some embodiments.

As shown in FIG. 1A-1, a dielectric layer 132 and a wiring layer 134 are formed over the interconnect structure 120, in accordance with some embodiments. The wiring layer 134 is formed in the dielectric layer 132, in accordance with some embodiments. The wiring layer 134 is also referred to as a top metal layer, in accordance with some embodiments. The wiring layer 134 includes a seed layer 134a and a conductive layer 134b, in accordance with some embodiments.

The conductive layer 134b is formed over the seed layer 134a, in accordance with some embodiments. The wiring layer 134 includes conductive lines 134c, 134d, and 134e, in accordance with some embodiments. The conductive vias 126 are electrically connected between the wiring layer 124 and the wiring layer 134, in accordance with some embodiments. The wiring layer 134 is thicker than each wiring layer 124, in accordance with some embodiments. The wiring layer 134 (or the dielectric layer 132) has a thickness T2 ranging from about 5000 Å to about 13000 Å, in accordance with some embodiments.

The dielectric structure 132 is made of an insulating material, such as oxides (e.g., silicon oxide), nitrides (e.g., silicon nitride or silicon oxynitride), or un-doped silicate glass (USG), in accordance with some embodiments. The seed layer 134a and the conductive layer 134b are made of metal (e.g., copper, aluminum, gold, silver, or tungsten) or alloy thereof, in accordance with some embodiments.

The seed layer 134a is formed using a deposition process, such as a physical vapor deposition process or a chemical vapor deposition process, in accordance with some embodiments. The conductive layer 134b is formed using a plating process, such as an electroplating process, in accordance with some embodiments. In some embodiments (not shown), a barrier layer is formed between the seed layer 134a and the dielectric layer 132 and between the seed layer 134a and the dielectric structure 122. The barrier layer is made of nitrides, such as tantalum nitride, in accordance with some embodiments.

As shown in FIG. 1A-1, an etch stop layer 140 is formed over the dielectric structure 132 and the wiring layer 134, in accordance with some embodiments. The etch stop layer 140 is thinner than the wiring layer 134 or the dielectric layer 132, in accordance with some embodiments. The etch stop layer 140 has a thickness T3 ranging from about 400 Å to about 1100 Å, in accordance with some embodiments.

The etch stop layer 140 is made of nitrides (e.g., silicon nitride or silicon oxynitride), in accordance with some embodiments. The etch stop layer 140 is formed using a deposition process, such as a chemical vapor deposition process or a physical vapor deposition process, in accordance with some embodiments.

As shown in FIGS. 1A-1 and 1A-2, a dielectric layer 150 is formed over the etch stop layer 140, in accordance with some embodiments. The dielectric layer 150 is thinner than the wiring layer 134 or the dielectric layer 132, in accordance with some embodiments. The dielectric layer 150 has a thickness T4 ranging from about 3000 Å to about 5000 Å, in accordance with some embodiments.

The dielectric layer 150 is made of an insulating material, such as oxides (e.g., silicon oxide), nitrides (e.g., silicon nitride or silicon oxynitride), or un-doped silicate glass (USG), in accordance with some embodiments. The dielectric layer 150 is formed using a deposition process, such as a chemical vapor deposition process (e.g., a plasma enhanced chemical vapor deposition (PECVD) process) or a physical vapor deposition process, in accordance with some embodiments.

As shown in FIGS. 1A-1 and 1A-2, a conductive layer 160 is formed over the dielectric layer 150, in accordance with some embodiments. The conductive layer 160 is used as a capacitor electrode, in accordance with some embodiments. The conductive layer 160 has an opening 162, in accordance with some embodiments. The opening 162 exposes a portion of the dielectric layer 150, in accordance with some embodiments.

The conductive layer 160 is thinner than the wiring layer 134, the dielectric layer 132, or the dielectric layer 150, in accordance with some embodiments. The conductive layer 160 has a thickness T5 ranging from about 100 Å to about 800 Å, in accordance with some embodiments. The thickness T5 ranges from about 200 Å to about 700 Å, in accordance with some embodiments.

The conductive layer 160 is made of a capacitor electrode material, in accordance with some embodiments. The capacitor electrode material includes metal (e.g., copper, aluminum, gold, silver, or tungsten), alloy thereof, nitrides (e.g., titanium nitride), or another suitable capacitor electrode material, in accordance with some embodiments.

The conductive layer 160 is formed using a deposition process (e.g., a physical vapor deposition process or a chemical vapor deposition process), a photolithography process, an etching process, and an optional cleaning and passivation process, in accordance with some embodiments. The cleaning and passivation process is used to clean the residues from the photolithography process and to passivate the surface of the conductive layer 160, in accordance with some embodiments. The cleaning and passivation process includes a plasma process using $N_2O$ or Ar as a process gas, in accordance with some embodiments.

As shown in FIGS. 1B-1 and 1B-2, a dielectric layer 170 is formed over the conductive layer 160 and the dielectric layer 150, in accordance with some embodiments. The dielectric layer 170 is used as a capacitor dielectric layer, in accordance with some embodiments. The dielectric layer 170 is thinner than the dielectric layer 150 or the conductive layer 160, in accordance with some embodiments. The dielectric layer 170 has a thickness T6 ranging from about 10 Å to about 200 Å, in accordance with some embodiments.

In some embodiments, the dielectric layer 170 is a single-layered structure. In some other embodiments, the dielectric layer 170 is a multi-layered structure. The multi-layered structure has layers, and each layer is made of a material different from that of adjacent layer(s), in accordance with some embodiments.

The dielectric layer 170 is made of a capacitor dielectric material, such as a high dielectric constant (high-k) material, in accordance with some embodiments. The high-k material is made of metal oxides, such as zirconium oxide ($ZrO_2$), hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide ($Al_2O_3$), hafnium dioxide-alumina ($HfO_2$—$Al_2O_3$) alloy, or combinations thereof, in accordance with some embodiments.

In some other embodiments, the high-k material is made of metal nitrides, metal silicates, transition metal-oxides, transition metal-nitrides, transition metal-silicates, oxynitrides of metals, other suitable materials, or combinations thereof. The dielectric layer 170 is formed using a deposition process, such as a chemical vapor deposition (CVD) process, a thermal atomic layer deposition (ALD) process, a plasma enhanced atomic layer deposition (PEALD) process, or another suitable deposition process.

As shown in FIGS. 1B-1 and 1B-2, a conductive layer 180 is formed over the dielectric layer 170, in accordance with some embodiments. The conductive layer 180 includes a conductive film 182 and a dummy film 184, in accordance with some embodiments. The conductive film 182 is used as a capacitor electrode, in accordance with some embodiments.

The conductive film 182 has an opening 182a, in accordance with some embodiments. The opening 182a exposes a portion of the dielectric layer 170, in accordance with some embodiments. The conductive film 182 partially overlaps the conductive layer 160, in accordance with some embodiments. The conductive film 182 is separated from the conductive layer 160 by the dielectric layer 170, in accordance with some embodiments.

The dummy film 184 is used as an etch buffer layer in a subsequent through-hole etching process, in accordance with some embodiments. The conductive film 182 and the dummy film 184 are spaced apart from each other, in accordance with some embodiments. The conductive film 182 and the dummy film 184 are electrically insulated from each other, in accordance with some embodiments.

The conductive layer 180 is thinner than the wiring layer 134, the dielectric layer 132, or the dielectric layer 150, in accordance with some embodiments. The conductive layer 180 is thicker than the dielectric layer 170, in accordance with some embodiments. The conductive layer 180 has a thickness T7 ranging from about 100 Å to about 800 Å, in accordance with some embodiments. The thickness T7 ranges from about 200 Å to about 700 Å, in accordance with some embodiments.

The conductive layer 180 is made of a capacitor electrode material, in accordance with some embodiments. The capacitor electrode material includes metal (e.g., copper, aluminum, gold, silver, or tungsten), alloy thereof, nitrides (e.g., titanium nitride), or another suitable capacitor electrode material, in accordance with some embodiments.

The conductive layer 180 is formed using a deposition process (e.g., a physical vapor deposition process or a chemical vapor deposition process), a photolithography process, an etching process, and an optional cleaning and passivation process, in accordance with some embodiments. The cleaning and passivation process is used to clean the residues from the photolithography process and to passivate the surface of the conductive layer 180, in accordance with some embodiments. The cleaning and passivation process includes a plasma process using $N_2O$ or Ar as a process gas, in accordance with some embodiments.

As shown in FIGS. 1C-1 and 1C-2, a dielectric layer 190 is formed over the conductive layer 180 and the dielectric layer 170, in accordance with some embodiments. The dielectric layer 190 is used as a capacitor dielectric layer, in accordance with some embodiments. The dielectric layer 190 is thinner than the dielectric layer 150 or the conductive layer 160 or 180, in accordance with some embodiments. The dielectric layer 190 has a thickness T8 ranging from about 10 Å to about 200 Å, in accordance with some embodiments.

In some embodiments, the dielectric layer 190 is a single-layered structure. In some other embodiments, the dielectric layer 190 is a multi-layered structure. The multi-layered structure has layers, and each layer is made of a material different from that of adjacent layer(s), in accordance with some embodiments.

The dielectric layer 190 is made of a capacitor dielectric material, such as a high dielectric constant (high-k) material, in accordance with some embodiments. The high-k material is made of metal oxides, such as zirconium oxide ($ZrO_2$), hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide ($Al_2O_3$), hafnium dioxide-alumina ($HfO_2$—$Al_2O_3$) alloy, or combinations thereof, in accordance with some embodiments.

In some other embodiments, the high-k material is made of metal nitrides, metal silicates, transition metal-oxides, transition metal-nitrides, transition metal-silicates, oxynitrides of metals, other suitable materials, or combinations thereof. The dielectric layer 190 is formed using a deposition process, such as a chemical vapor deposition (CVD) process, a thermal atomic layer deposition (ALD) process, a plasma enhanced atomic layer deposition (PEALD) process, or another suitable deposition process.

As shown in FIGS. 1C-1 and 1C-2, a conductive layer 210 is formed over the dielectric layer 190, in accordance with some embodiments. The conductive layer 210 includes a conductive film 212 and dummy films 214 and 216, in accordance with some embodiments. The conductive film 212 is used as a capacitor electrode, in accordance with some embodiments. The conductive film 212 has an opening 212a, in accordance with some embodiments. The opening 212a exposes a portion of the dielectric layer 190, in accordance with some embodiments.

The conductive layer 210 partially overlaps the conductive layer 180, in accordance with some embodiments. The conductive film 212 overlaps the conductive film 182, in accordance with some embodiments. The dummy film 214 overlaps the dummy film 184, in accordance with some embodiments. The conductive layer 210 is separated from the conductive layer 180 by the dielectric layer 190, in accordance with some embodiments.

The dummy films 214 and 216 are used as an etch buffer layer in a subsequent through-hole etching process, in accordance with some embodiments. The dummy film 216 is in the opening 212a, in accordance with some embodiments. The conductive film 212 and the dummy films 214 and 216 are spaced apart from each other, in accordance with some embodiments. The conductive film 212 and the dummy films 214 and 216 are electrically insulated from each other, in accordance with some embodiments.

The conductive layer 210 is thinner than the wiring layer 134, the dielectric layer 132, or the dielectric layer 150, in accordance with some embodiments. The conductive layer 210 is thicker than the dielectric layer 190, in accordance with some embodiments. The conductive layer 210 has a thickness T9 ranging from about 100 Å to about 800 Å, in accordance with some embodiments. The thickness T9 ranges from about 200 Å to about 700 Å, in accordance with some embodiments.

The conductive layer 210 is made of a capacitor electrode material, in accordance with some embodiments. The capacitor electrode material includes metal (e.g., copper, aluminum, gold, silver, or tungsten), alloy thereof, nitrides (e.g., titanium nitride), or another suitable capacitor electrode material, in accordance with some embodiments.

The conductive layer 210 is formed using a deposition process (e.g., a physical vapor deposition process or a chemical vapor deposition process), a photolithography process, an etching process, and an optional cleaning and passivation process, in accordance with some embodiments. The cleaning and passivation process is used to clean the residues from the photolithography process and to passivate the surface of the conductive layer 210, in accordance with some embodiments. The cleaning and passivation process includes a plasma process using $N_2O$ or Ar as a process gas, in accordance with some embodiments.

As shown in FIG. 1D-1, a dielectric layer 220 is formed over the conductive layer 210 and the dielectric layer 190, in accordance with some embodiments. The dielectric layer 220 is thinner than the wiring layer 134 or the dielectric layer 132, in accordance with some embodiments. The dielectric layer 220 has a thickness T10 ranging from about 3500 Å to about 5500 Å, in accordance with some embodiments.

The dielectric layer 220 is made of an insulating material, such as oxides (e.g., silicon oxide), nitrides (e.g., silicon nitride or silicon oxynitride), or un-doped silicate glass (USG), in accordance with some embodiments. The dielectric layer 220 is formed using a deposition process, such as a chemical vapor deposition process (e.g., a plasma enhanced chemical vapor deposition process) or a physical vapor deposition process, in accordance with some embodiments.

For the sake of clarity, FIG. 1E-2 omits the dielectric layer 220, in accordance with some embodiments. As shown in FIGS. 1E-1 and 1E-2, portions of the dielectric layer 220, the conductive layer 210, the dielectric layer 190, the conductive layer 180, the dielectric layer 170, the conductive layer 160, the dielectric layer 150, and the etch stop layer 140 are removed to form through holes 232, 234, and 236, in accordance with some embodiments. The through holes 232, 234, and 236 respectively expose the conductive lines 134c, 134d, and 134e, in accordance with some embodiments.

The through hole 232 passes directly through the dummy films 184 and 214, in accordance with some embodiments. The through hole 234 passes directly through the dummy film 216 and the conductive film 182, in accordance with some embodiments. The through hole 236 passes directly through the conductive film 212 and the conductive layer 160, in accordance with some embodiments.

The formation of the dummy films 184, 214, and 216 helps the through holes 232, 234, and 236 pass directly through the same number (i.e., 2) of conductive layers 160, 180, and 210. Therefore, the removal process for forming the through holes 232, 234, and 236 may be performed uniformly and over etching of the conductive lines 134c and 134d may be prevented.

The through hole 232 directly and passes indirectly through the dielectric layer 220, the conductive layer 210, the dielectric layer 190, the conductive layer 180, the dielectric layer 170, the dielectric layer 150, and the etch stop layer 140, in accordance with some embodiments.

In some embodiments, the through hole 234 passes indirectly through the conductive layer 160. The through hole 234 directly and passes indirectly through the dielectric layer 220, the conductive layer 210, the dielectric layer 190, the conductive layer 180, the dielectric layer 170, the conductive layer 160, the dielectric layer 150, and the etch stop layer 140, in accordance with some embodiments.

The through hole 236 passes indirectly through the conductive film 182 of the conductive layer 180, in accordance with some embodiments. The through hole 236 directly and passes indirectly through the dielectric layer 220, the conductive layer 210, the dielectric layer 190, the conductive layer 180, the dielectric layer 170, the conductive layer 160, the dielectric layer 150, and the etch stop layer 140, in accordance with some embodiments.

For the sake of clarity, FIG. 1F-2 omits the dielectric layer 220, in accordance with some embodiments. As shown in FIGS. 1F-1 and 1F-2, conductive structures 242, 244 and 246 are respectively formed in and over the through holes 232, 234, and 236, in accordance with some embodiments.

Each of the conductive structure 242, 244, or 246 includes a seed layer 241a and a conductive layer 241b, in accordance with some embodiments. The conductive layer 241b is formed over the seed layer 241a, in accordance with some embodiments.

The conductive structure 242 includes a conductive via 242v and a conductive pad 242p, in accordance with some embodiments. The conductive via 242v is in the through hole 232, in accordance with some embodiments. The conductive via 242v is electrically connected to the conductive line 134c, in accordance with some embodiments. The conductive pad 242p is over and in direct contact with the conductive via 242v, in accordance with some embodiments.

The conductive structure 244 includes a conductive via 244v and a conductive pad 244p, in accordance with some embodiments. The conductive via 244v is in the through hole 234, in accordance with some embodiments. The conductive via 244v is electrically connected to the conductive film 182 and the conductive line 134d, in accordance with some embodiments. The conductive pad 244p is over and in direct contact with the conductive via 244v, in accordance with some embodiments.

The conductive structure 246 includes a conductive via 246v and a conductive pad 246p, in accordance with some embodiments. The conductive via 246v is in the through hole 236, in accordance with some embodiments. The conductive via 246v is electrically connected to the conductive layer 160, the conductive film 212, and the conductive line 134e, in accordance with some embodiments.

The conductive film 212, the dielectric layer 190, and the conductive film 182 together form a first capacitor, in accordance with some embodiments. The conductive layer 160, the dielectric layer 170, and the conductive film 182 together form a second capacitor, in accordance with some embodiments. The first capacitor is electrically connected in parallel with the second capacitor via the conductive structures 244 and 246, in accordance with some embodiments.

The conductive pad 246p is over and in direct contact with the conductive via 246v, in accordance with some embodiments. The conductive layer 160, 180 or 210 is thinner than the conductive pad 242p, 244p or 246p, in accordance with some embodiments. The conductive pad 242p, 244p or 246p has a thickness T11 ranging from about 5000 Å to about 11000 Å, in accordance with some embodiments.

The seed layer 241a and the conductive layer 241b are made of metal (e.g., aluminum, copper, gold, silver, or tungsten) or alloy thereof, in accordance with some embodiments. The formation of the seed layer 241a and the conductive layer 241b includes performing a deposition process to form a seed material layer (not shown); performing a plating process to form a conductive material layer (not shown); and performing a photolithography process and an etching process, in accordance with some embodiments. The deposition process includes a physical vapor deposition process or a chemical vapor deposition process, in accordance with some embodiments. The plating process includes an electroplating process, in accordance with some embodiments.

As shown in FIG. 1G-1, a dielectric layer 250 is formed over the conductive structures 242, 244 and 246 and the dielectric layer 220, in accordance with some embodiments. The dielectric layer 250 has openings 252, 254, and 256, in accordance with some embodiments. The openings 252, 254, and 256 respectively expose the conductive structures 242, 244 and 246, in accordance with some embodiments.

The dielectric layer 250 has a thickness T12 ranging from about 9000 Å to about 15000 Å, in accordance with some embodiments.

The dielectric layer 250 is made of an insulating material, such as oxides (e.g., silicon oxide), nitrides (e.g., silicon nitride or silicon oxynitride), or un-doped silicate glass (USG), in accordance with some embodiments. The dielectric layer 250 is formed using a deposition process, such as a chemical vapor deposition process or a physical vapor deposition process, in accordance with some embodiments.

As shown in FIG. 1G-1, a protective layer 260 is formed over the dielectric layer 250, in accordance with some embodiments. The protective layer 260 is used to protect the dielectric layer 250 from damage or being affected by moisture, in accordance with some embodiments. The protective layer 260 has openings 262, 264, and 266, in accordance with some embodiments. The openings 262, 264, and 266 respectively expose the conductive structures 242, 244 and 246, in accordance with some embodiments. The protective layer 260 has a thickness T13 ranging from about 3500 Å to about 10000 Å, in accordance with some embodiments.

The protective layer 260 is made of an insulating material, such as nitrides (e.g., silicon nitride or silicon oxynitride), in accordance with some embodiments. The protective layer 260 is formed using a deposition process, such as a chemical vapor deposition process or a physical vapor deposition process, in accordance with some embodiments.

As shown in FIG. 1G-1, a seed layer 272 is formed over the protective layer 260, the dielectric layer 250, and the conductive structures 242, 244 and 246, in accordance with some embodiments. The seed layer 272 is made of metal (e.g., copper, aluminum, gold, silver, or tungsten) or alloy thereof, in accordance with some embodiments. The seed layer 272 is formed using a deposition process, such as a physical vapor deposition process or a chemical vapor deposition process, in accordance with some embodiments.

As shown in FIG. 1G-1, a mask layer 280 is formed over the seed layer 272, in accordance with some embodiments. The mask layer 280 has openings 282, 284, and 286 respectively over the openings 262, 264, and 266, in accordance with some embodiments. The openings 282, 284, and 286 expose portions of the seed layer 272, in accordance with some embodiments. The mask layer 280 is made of a polymer material, such as a photoresist material, in accordance with some embodiments.

As shown in FIG. 1G-1, conductive layers 274 are formed over the exposed seed layer 272 and in the openings 282, 284, and 286, in accordance with some embodiments. The conductive layers 274 are made of metal (e.g., copper, aluminum, gold, silver, or tungsten) or alloy thereof, in accordance with some embodiments. The conductive layers 274 are formed using a plating process, such as an electroplating process, in accordance with some embodiments.

As shown in FIG. 1G-1, conductive layers 290a are formed over the conductive layers 274, in accordance with some embodiments. The conductive layers 290a are made of a solder material, such as tin, in accordance with some embodiments. The conductive layers 290a are formed using a plating process, such as an electroplating process, in accordance with some embodiments.

As shown in FIGS. 1G-1 and 1H-1, the mask layer 280 and the seed layer 272 under the mask layer 280 are removed, in accordance with some embodiments. After the removal process, each conductive layer 274 and the seed layer 272 thereunder together form a bump structure 270, in accordance with some embodiments. The bump structure 270 is over and in direct contact with the conductive structure 242, 244 or 246, in accordance with some embodiments. As shown in FIG. 1H-1, a reflow process is performed over the conductive layer 290a to form solder balls 290, in accordance with some embodiments. In this step, a chip structure 100 is substantially formed, in accordance with some embodiments.

The width W1 of the conductive via 242v, 244v or 246v is greater than the width W2 of the conductive via 126 of the interconnect structure 120, in accordance with some embodiments. The width W1 ranges from about ?? Å to about ?? Å, in accordance with some embodiments. The width W2 ranges from about ?? Å to about ?? Å, in accordance with some embodiments. (Note to TSMC inventor: Please provide possible range of the widths W1 and W2, thank you!)

Since the first capacitor and the second capacitor are integrated into the chip structure 100, the conductive path between the device elements, which are formed at the surface 112 of the substrate 110, and the first and second capacitors is greatly reduced, in accordance with some embodiments. Therefore, the resistance of aforementioned conductive path is greatly reduced, in accordance with some embodiments.

Furthermore, since the conductive via 242v, 244v or 246v is wider than the conductive via 126 of the interconnect structure 120, the contact area between the conductive via 242v, 244v or 246v and the first and second capacitors is larger than the contact area between the conductive via 126 and a capacitor (not shown) formed in the interconnect structure 120. Therefore, the charging speed of the first and second capacitors is improved, and the operation frequency of the first and second capacitors is improved as well, in accordance with some embodiments.

Figure 2A:
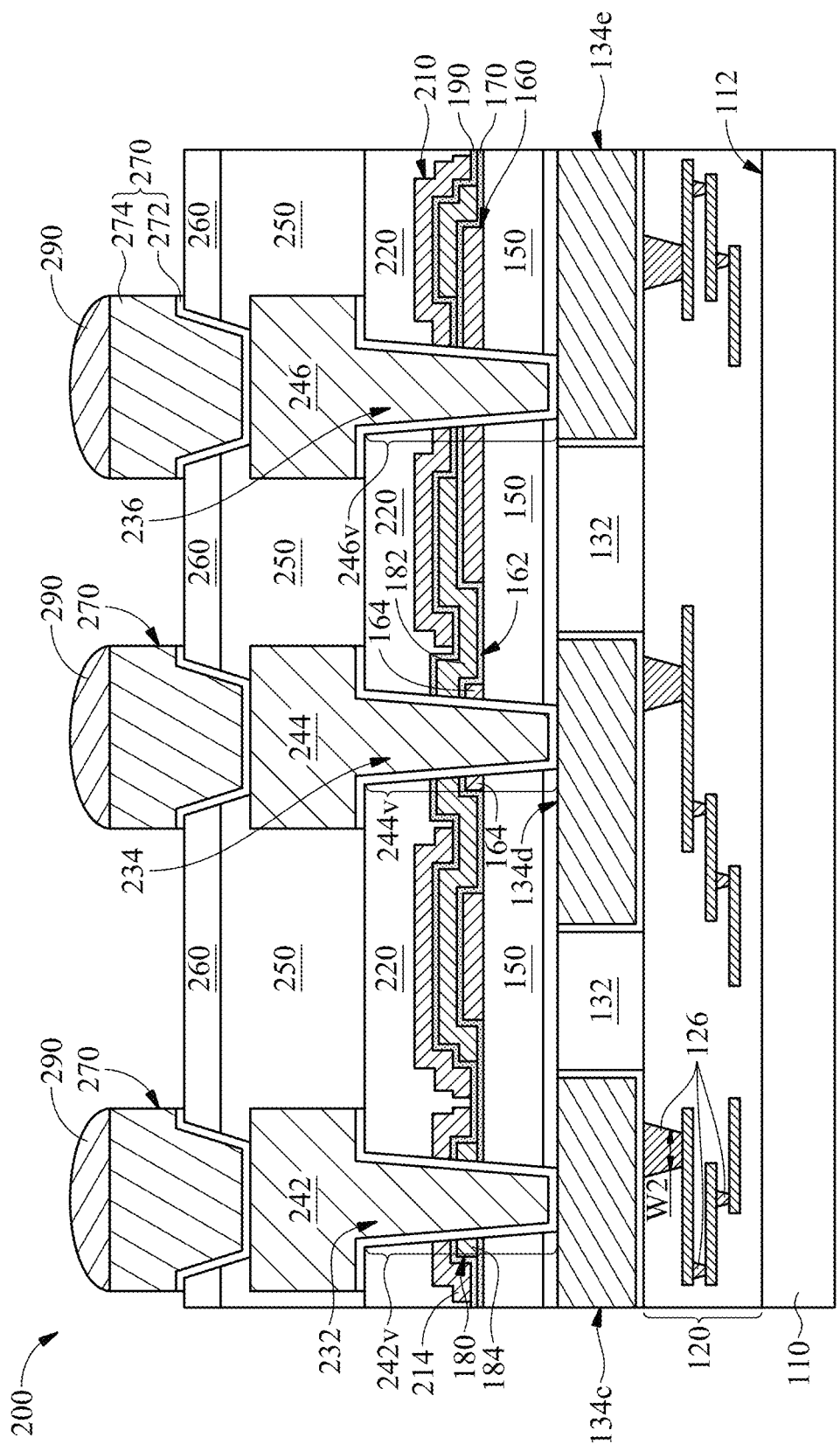
FIG. 2A is a cross-sectional view of a chip structure, in accordance with some embodiments.
Figure 2B:
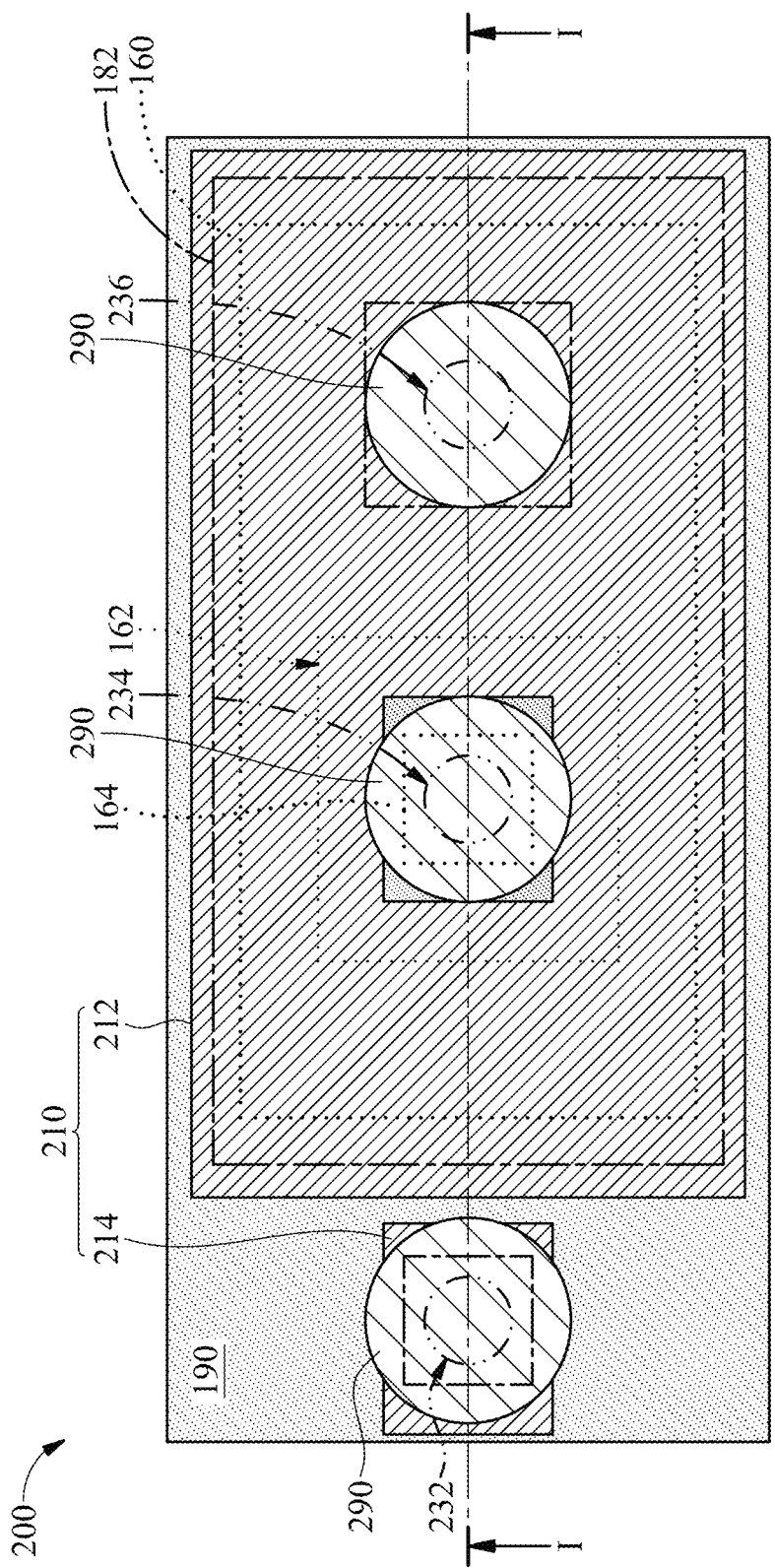
FIG. 2B is a top view of the chip structure of FIG. 2A, in accordance with some embodiments.

FIG. 2A is a cross-sectional view of a chip structure 200, in accordance with some embodiments. FIG. 2B is a top view of the chip structure 200 of FIG. 2A, in accordance with some embodiments. As shown in FIGS. 2A and 2B, the chip structure 200 is similar to the chip structure 100 of FIG. 1H-1, except that the conductive layer 160 of the chip structure 200 further has a dummy film 164, and the conductive layer 210 of the chip structure 200 does not have the dummy film 216, in accordance with some embodiments.

The dummy film 164 is in the opening 162 of the conductive layer 160, in accordance with some embodiments. The conductive structure 244 passes directly through the dummy film 164 of the conductive layer 160 and the conductive film 182 of the conductive layer 180, in accordance with some embodiments.

Figures 1, 3A:
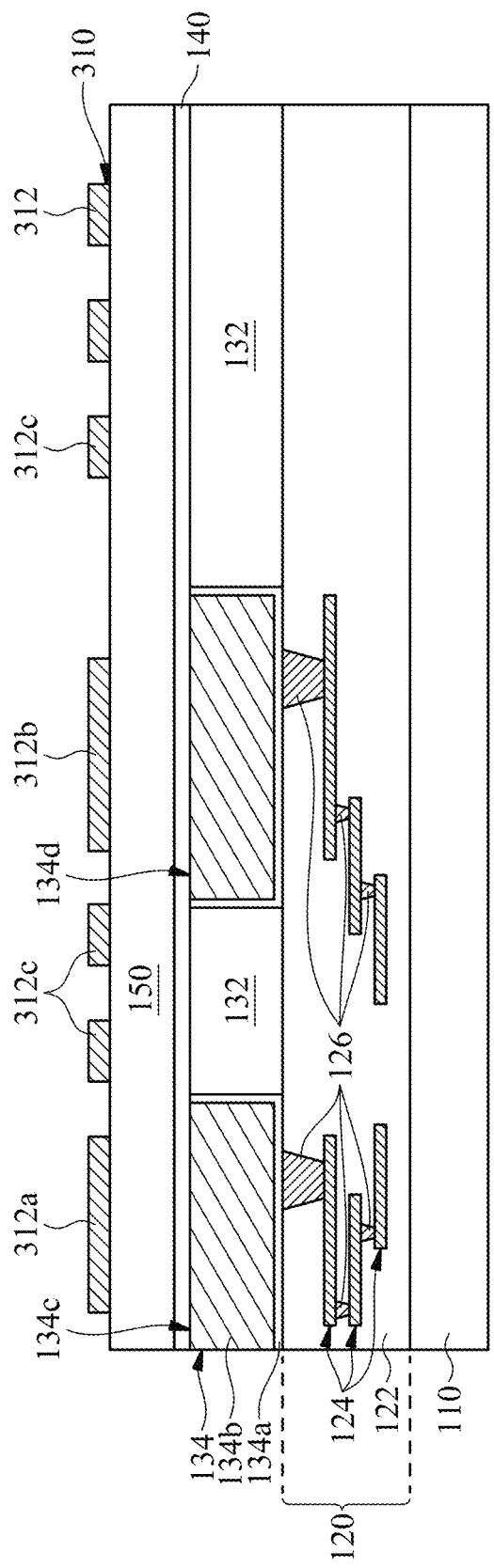
Figures 2, 3A:
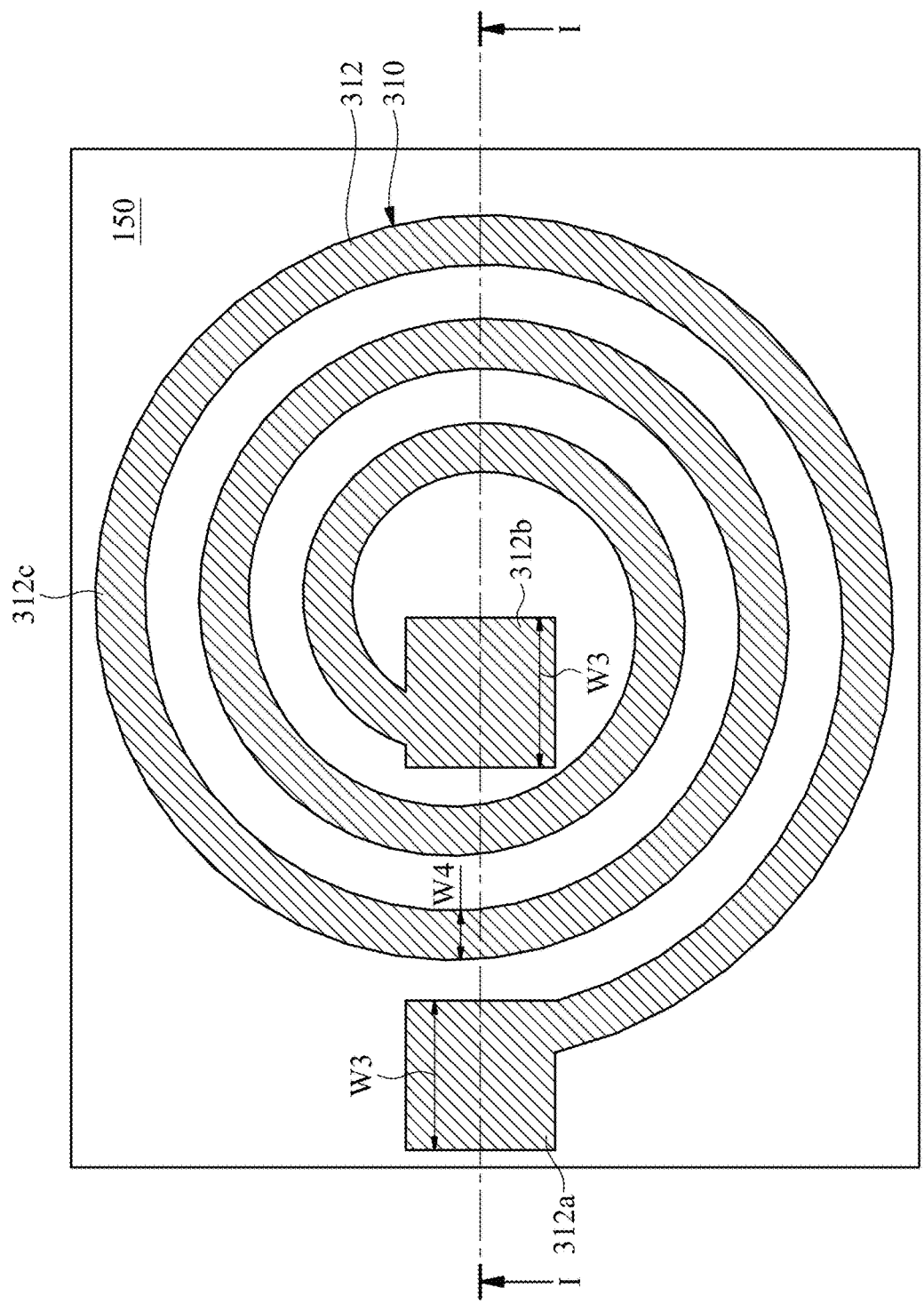
Figures 1, 3B:
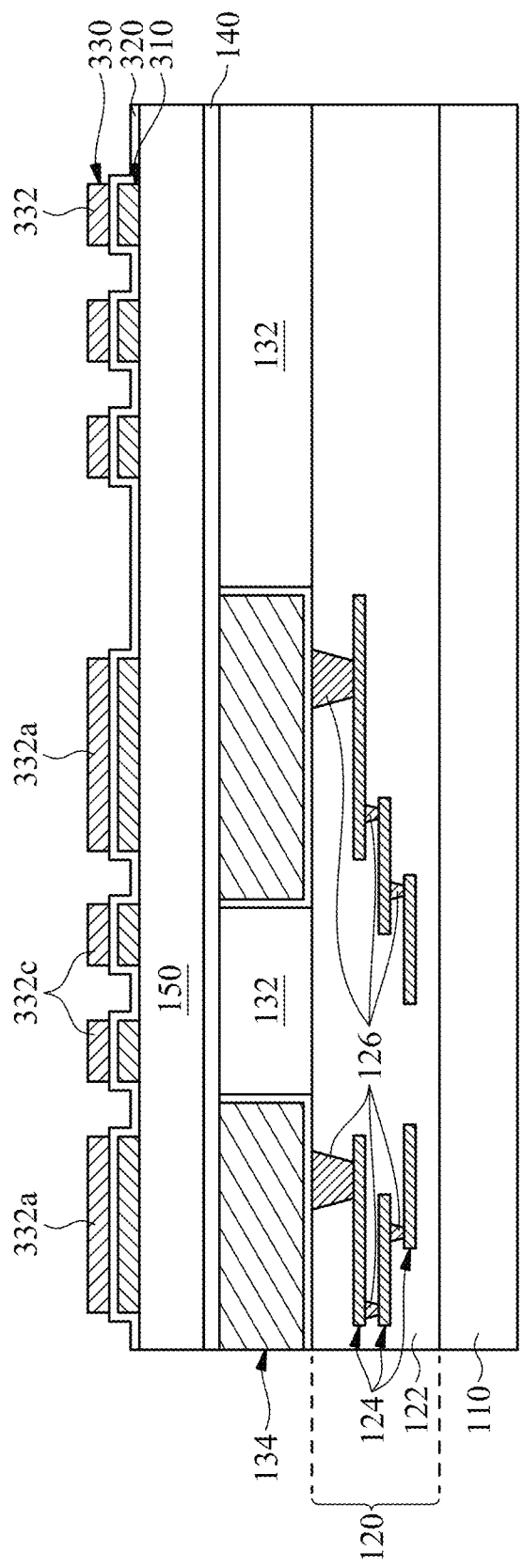
Figures 2, 3B:
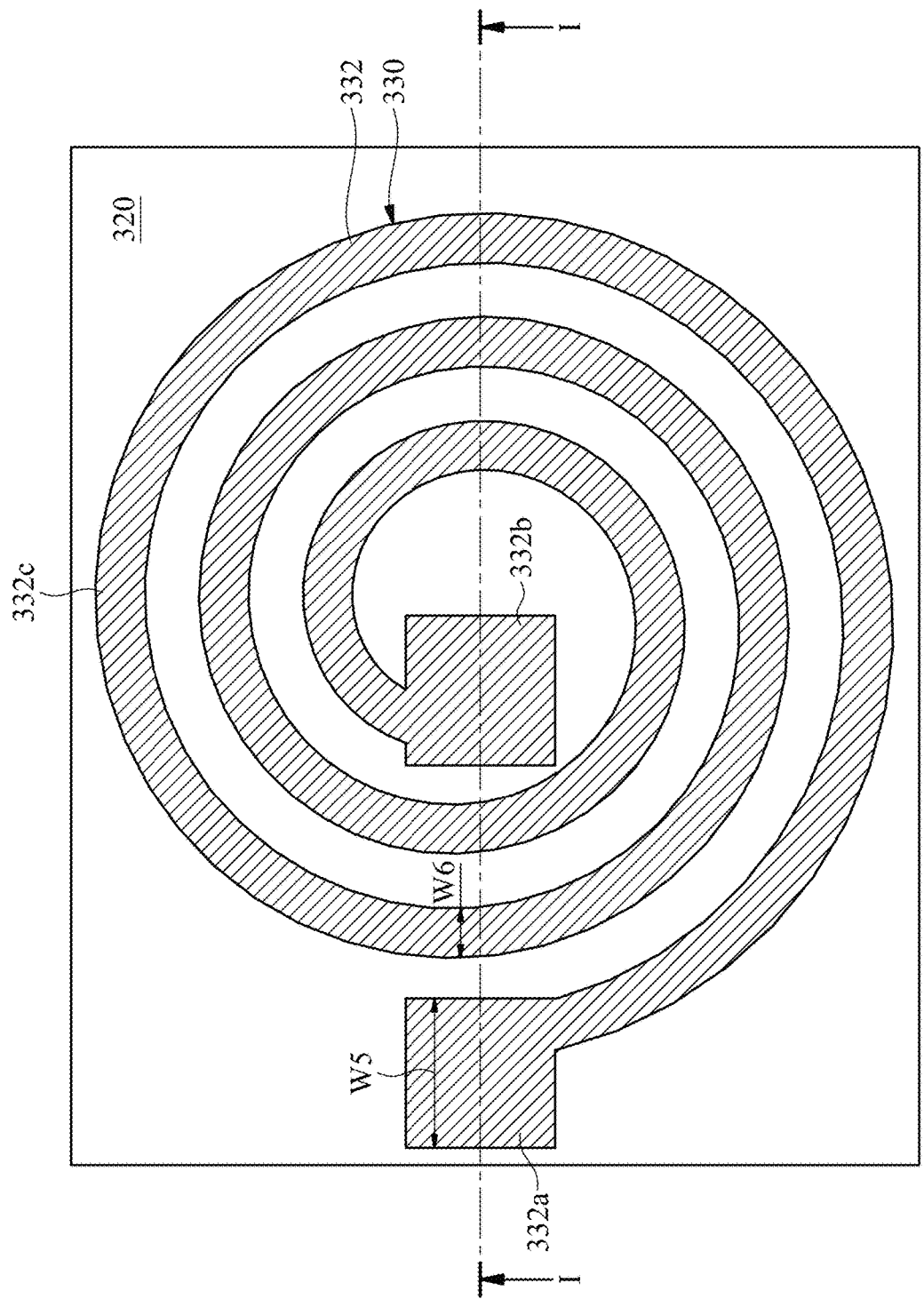
Figures 1, 3C:
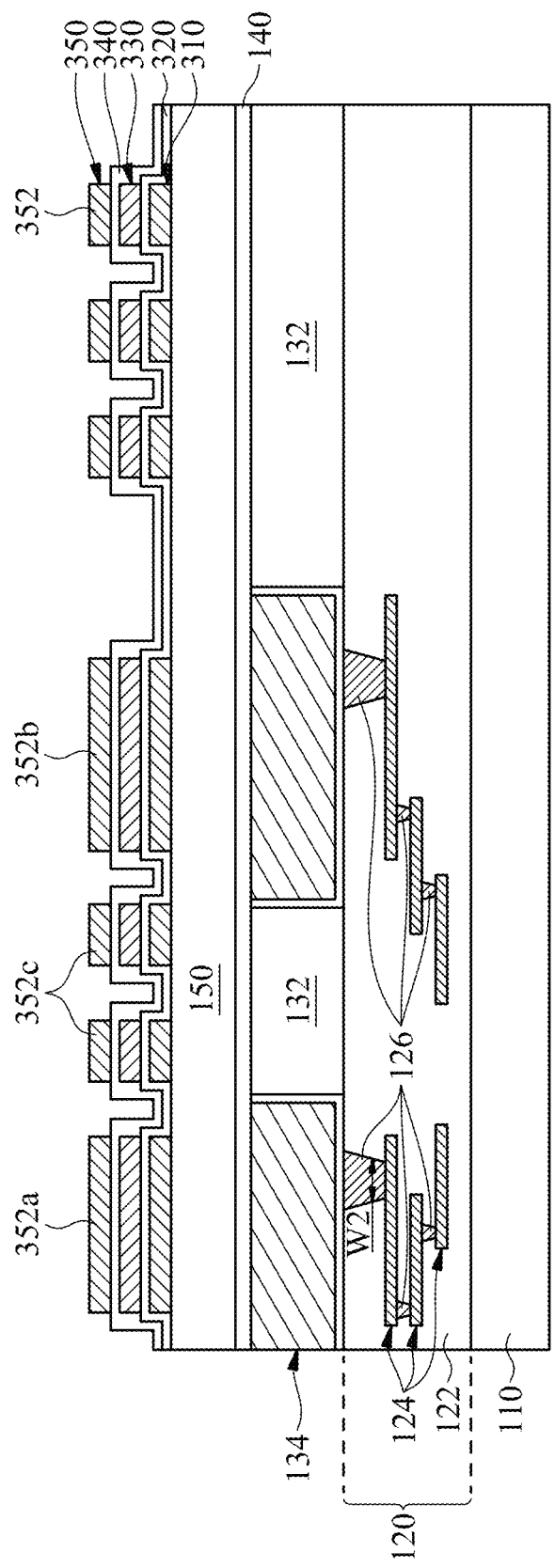
Figures 2, 3C:
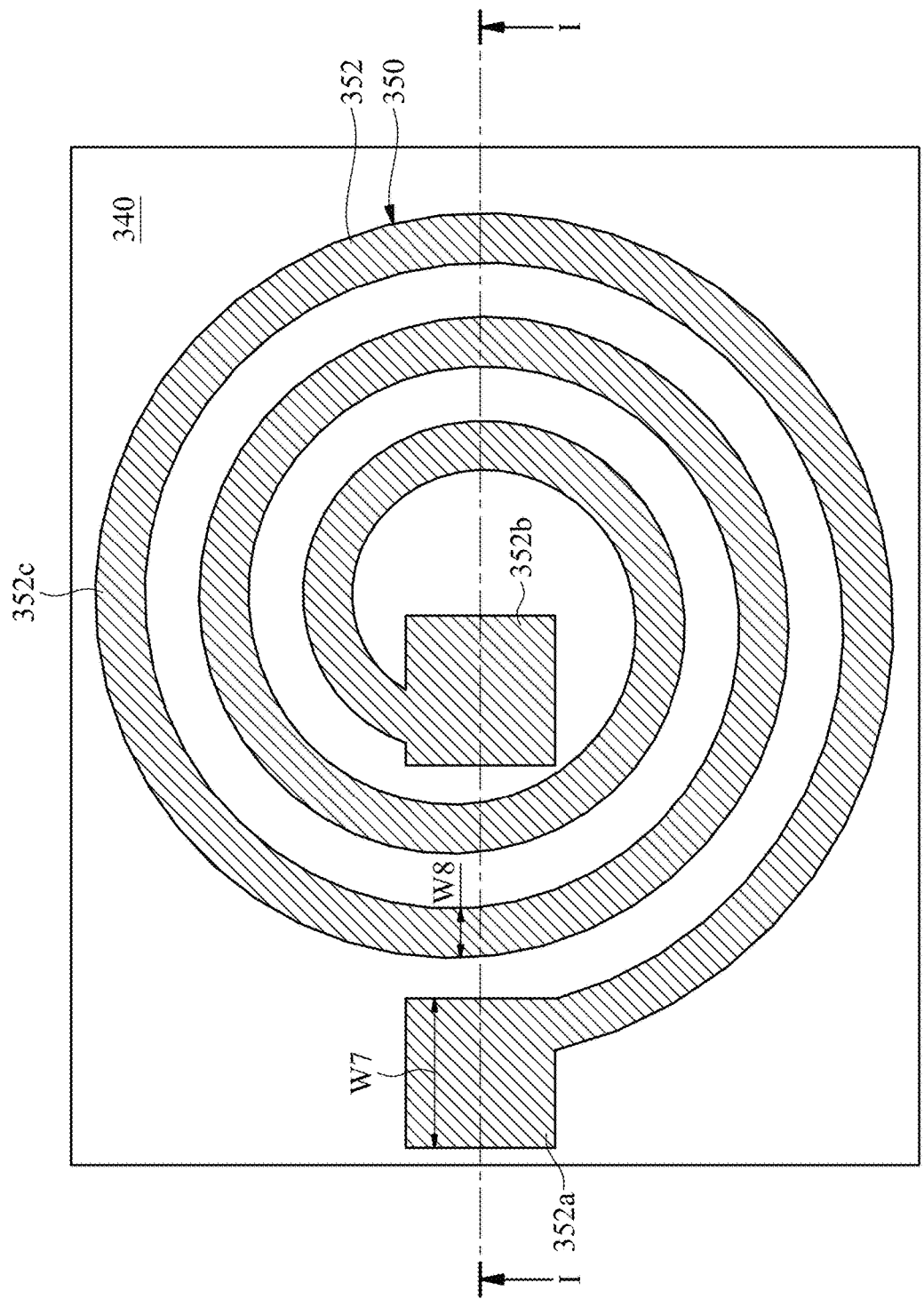
Figures 1, 3D:
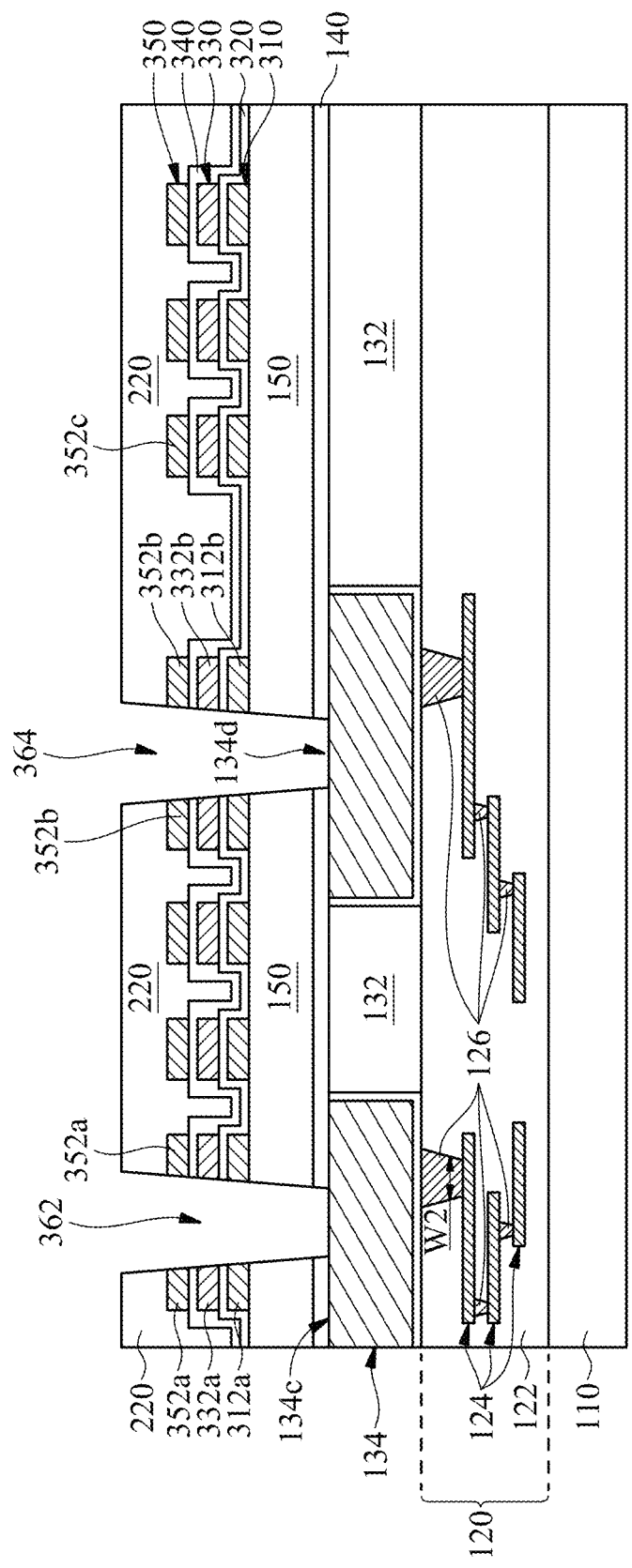
Figures 2, 3D:
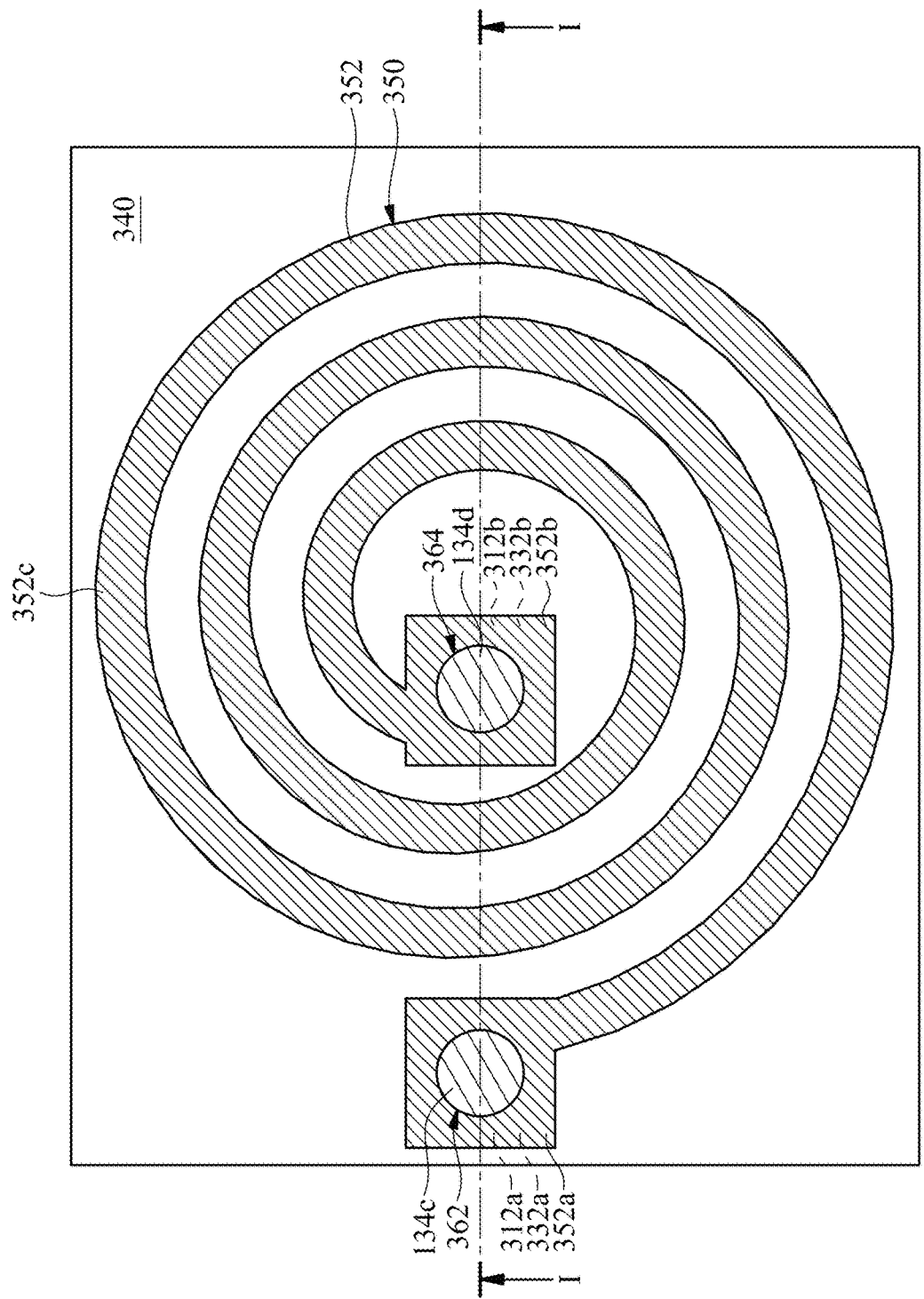
Figures 1, 3E:
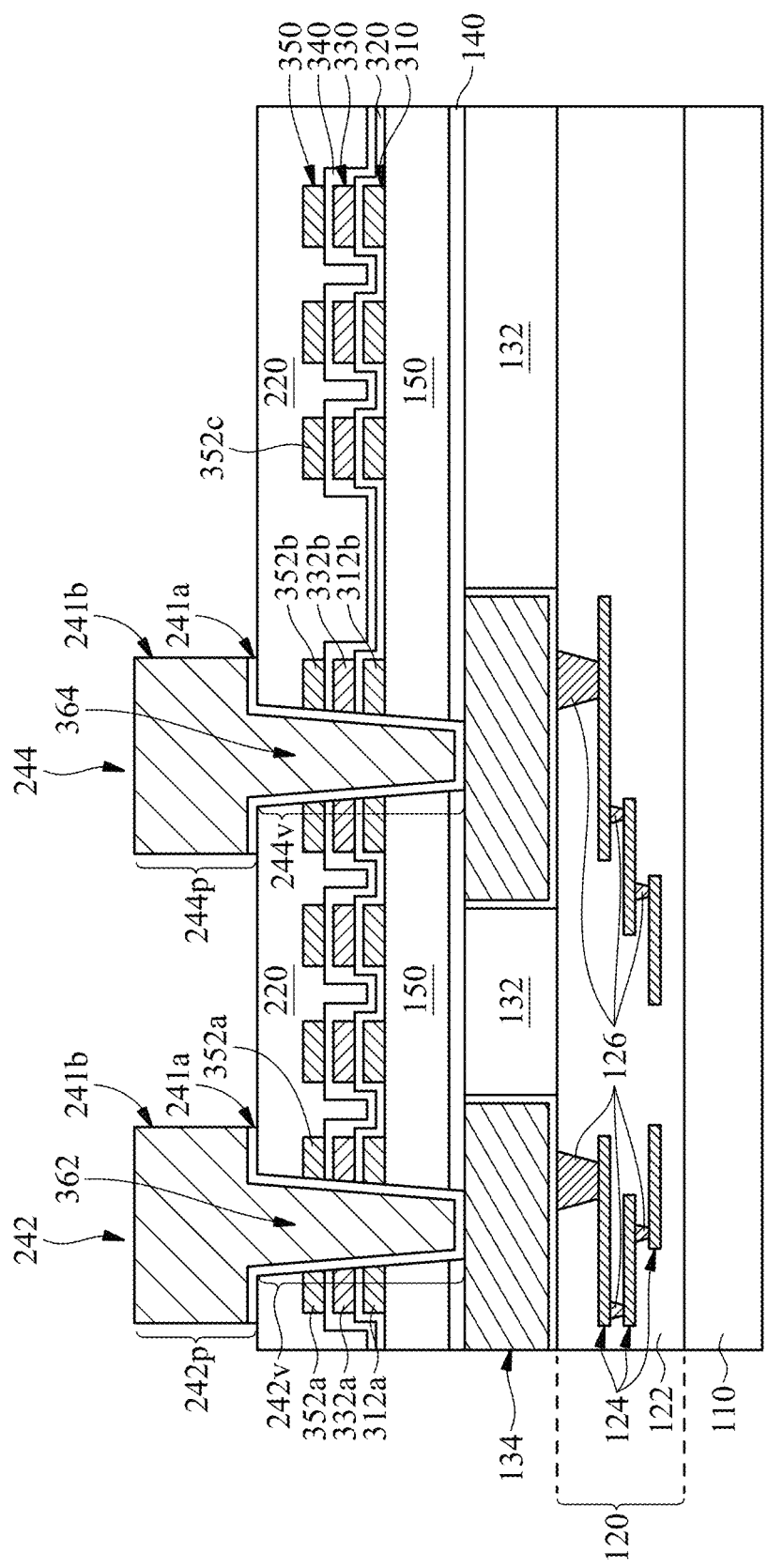
Figures 2, 3E:
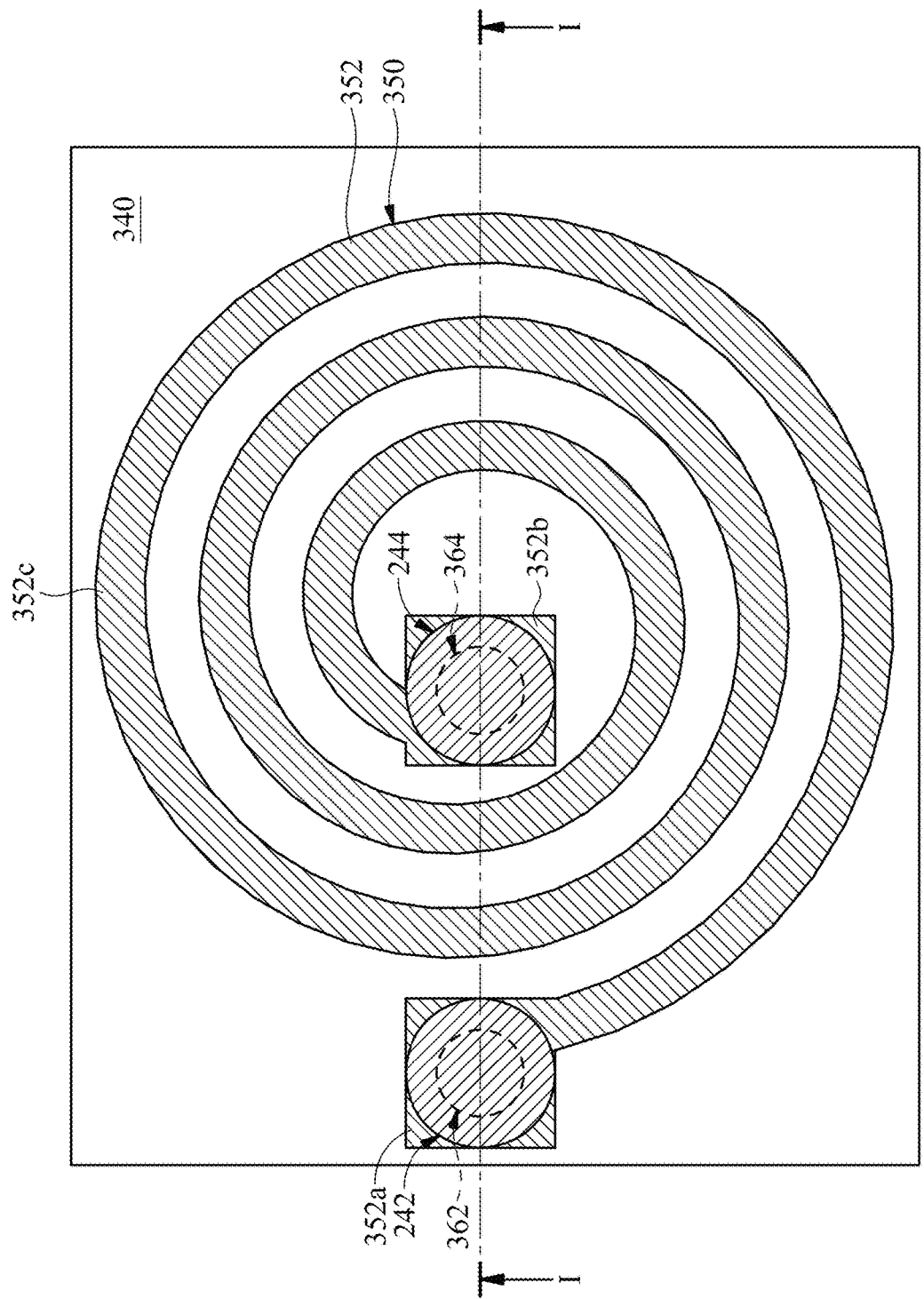
Figures 1, 3F:
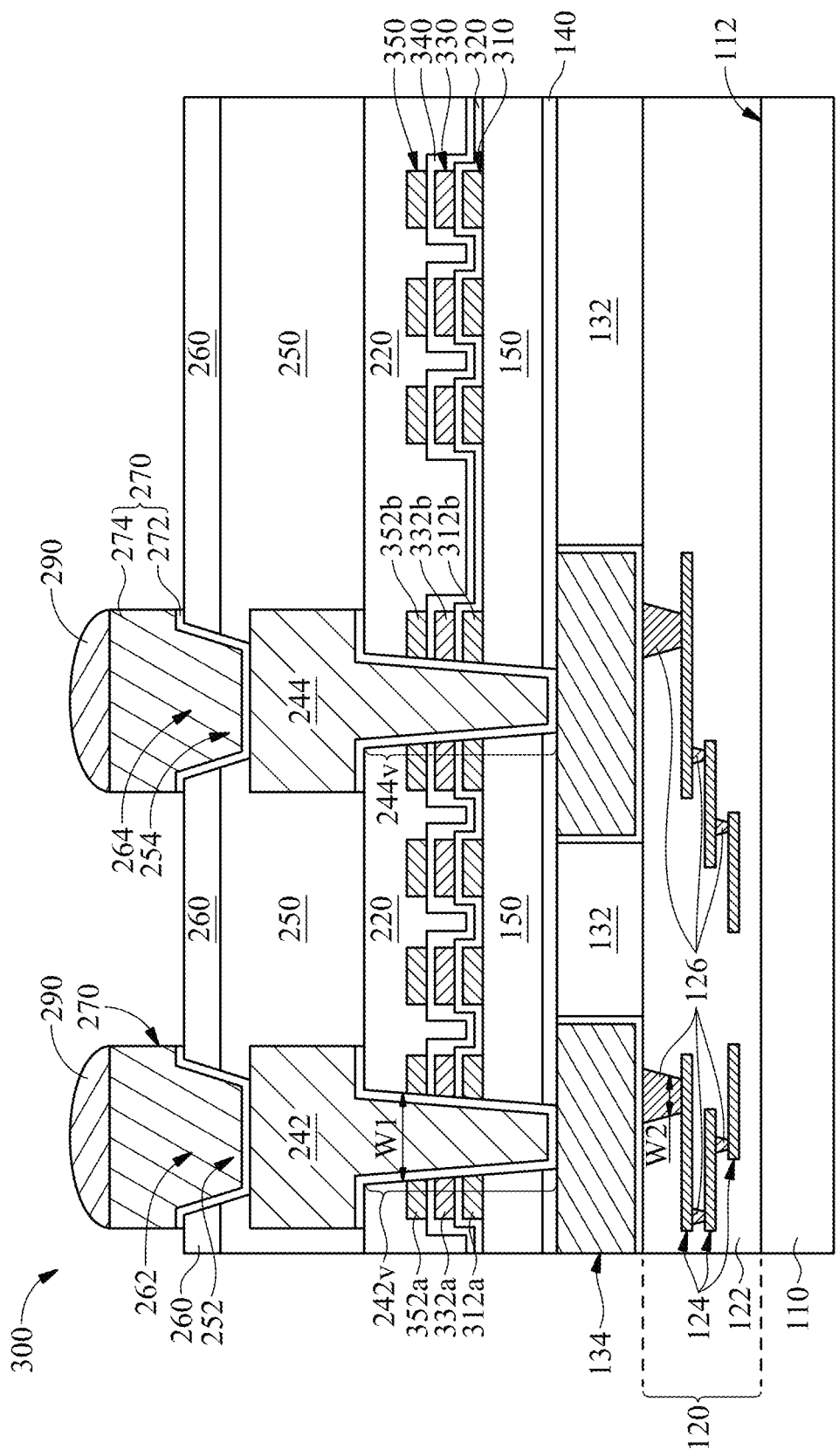

FIG. 3A-1 to FIG. 3F-1 are cross-sectional views of various stages of a process for forming a chip structure, in accordance with some embodiments. FIG. 3A-2 to FIG. 3E-2 are top views illustrating the chip structure in FIG. 3A-1 to FIG. 3E-1, in accordance with some embodiments.

As shown in FIGS. 3A-1 and 3A-2, a step similar to the step of FIG. 1A-1 is performed to form a substrate 110, an interconnect structure 120, a dielectric layer 132, a wiring layer 134, an etch stop layer 140, a dielectric layer 150, and a conductive layer 310, in accordance with some embodiments.

The step of FIGS. 3A-1 and 3A-2 is similar to that of the FIGS. 1A-1 and 1A-2, except that in comparison with the conductive layer 160 formed in the step of FIGS. 1A-1 and 1A-2, the conductive layer 310 formed in the step of FIGS. 3A-1 and 3A-2 includes a conductive line 312, and the conductive line 312 has a spiral shape, in accordance with some embodiments. The conductive layer 310 is used as an inductor, in accordance with some embodiments.

The conductive line 312 has end portions 312a and 312b and a main portion 312c, in accordance with some embodiments. The end portions 312a and 312b are connected to the main portion 312c, in accordance with some embodiments. The end portion 312a or 312b is wider than the main portion 312c, in accordance with some embodiments. That is, a line width W3 of the end portion 312a or 312b is greater than a line width W4 of the main portion 312c, in accordance with some embodiments.

Figure 4:
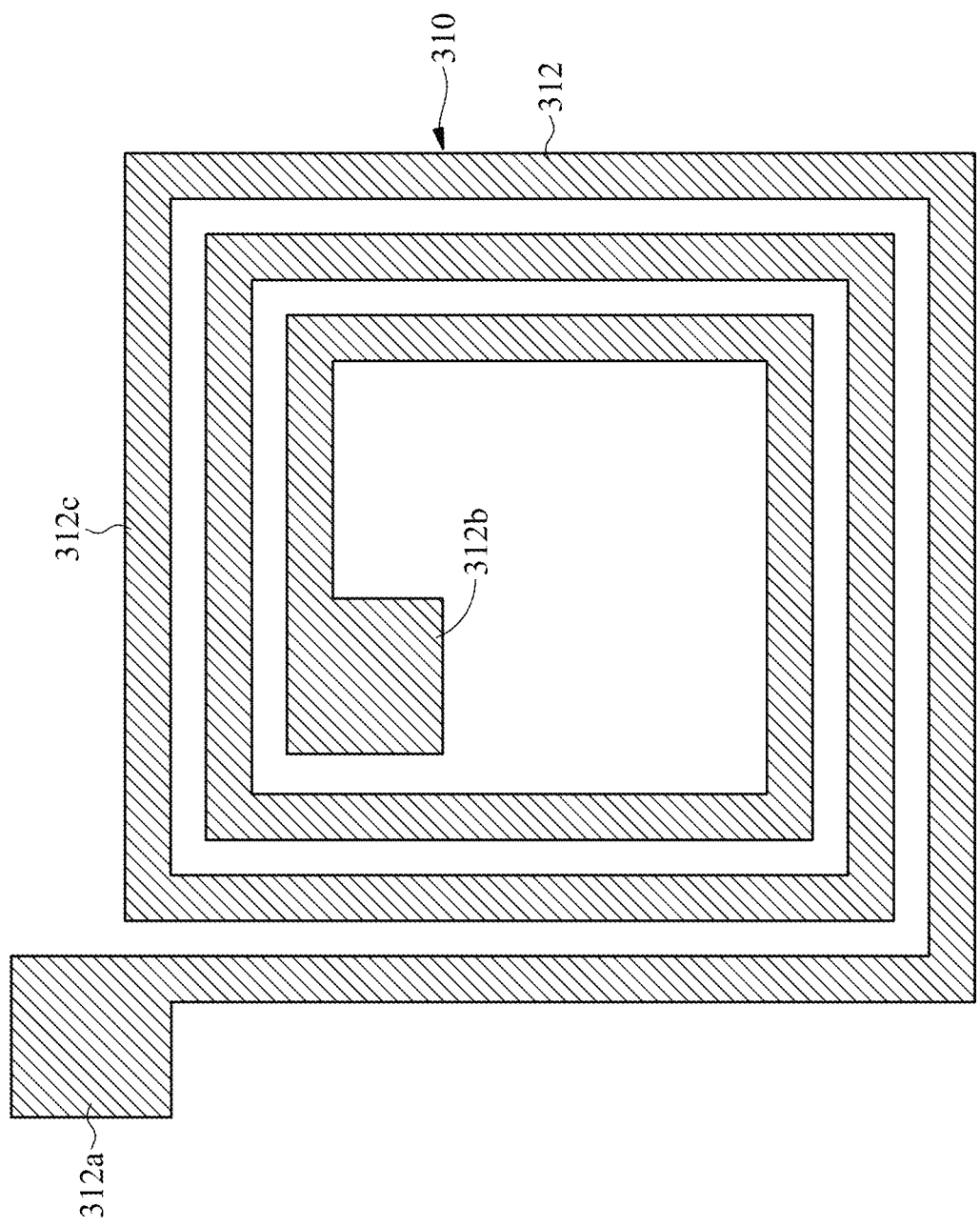
FIG. 4 is a top view of a conductive layer of FIG. 3A-1, in accordance with some embodiments.
Figure 5:
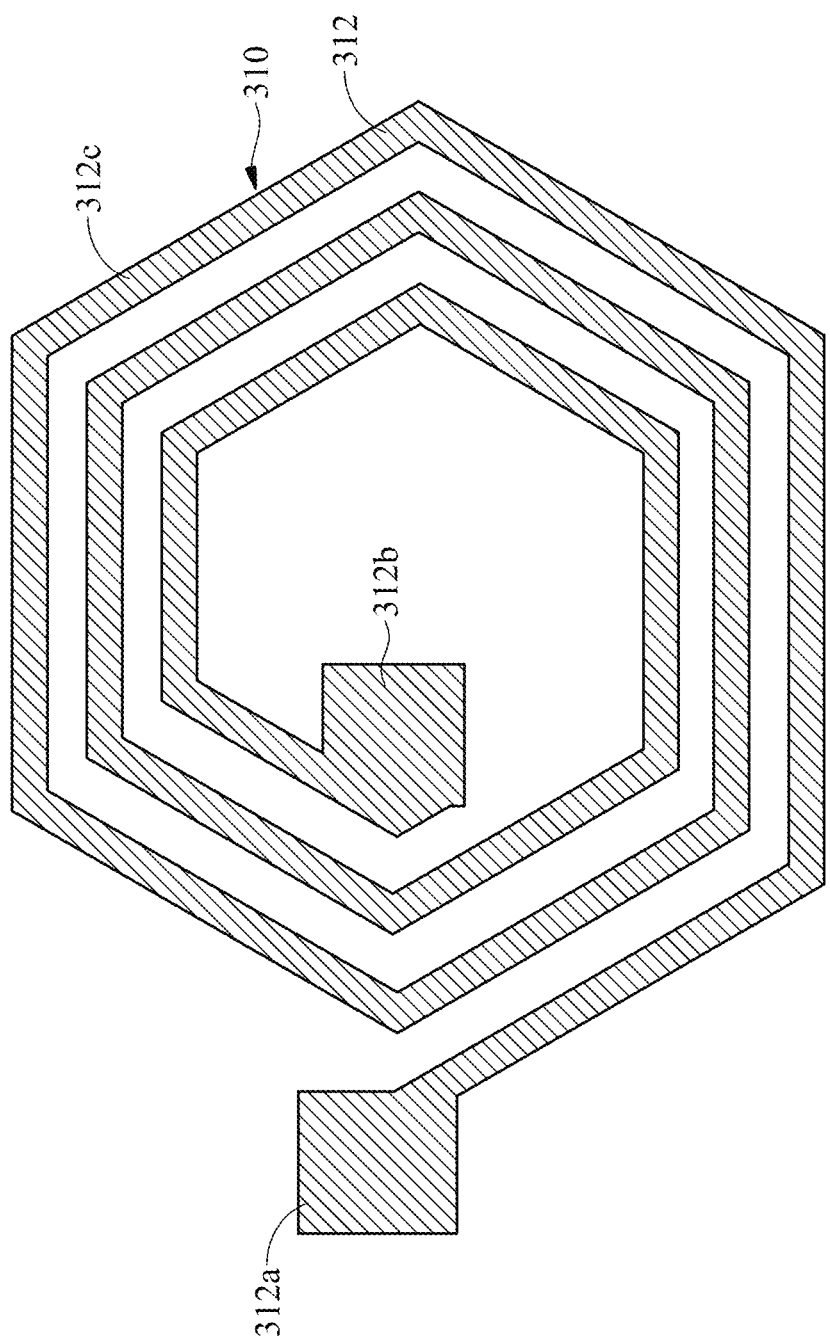
FIG. 5 is a top view of a conductive layer of FIG. 3A-1, in accordance with some embodiments.
Figure 6:
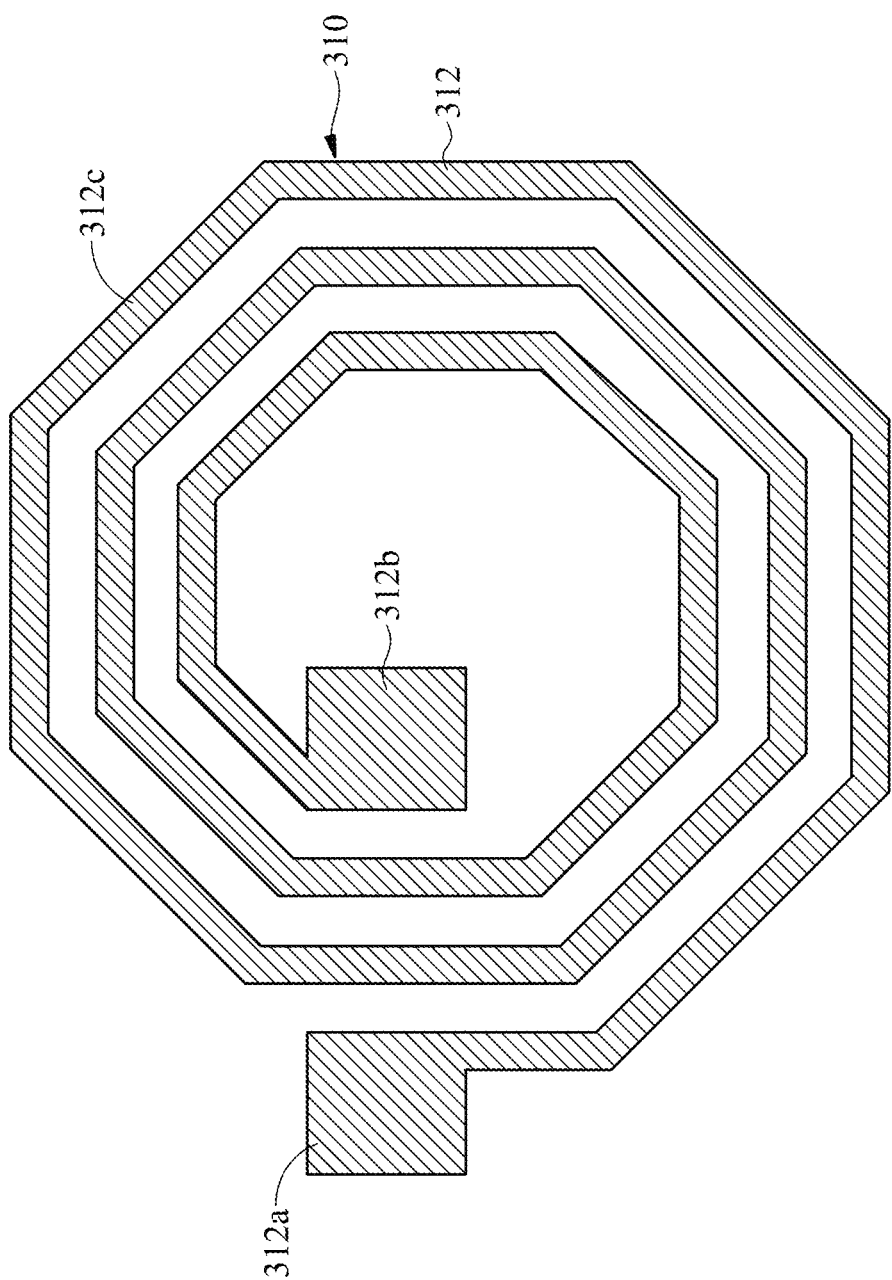
FIG. 6 is a top view of a conductive layer of FIG. 3A-1, in accordance with some embodiments.

The conductive line 312 may have a round spiral shape (as shown in FIG. 3A-2), a square spiral shape (as shown in FIG. 4), a hexagonal spiral shape (as shown in FIG. 5), or an octagonal spiral shape (as shown in FIG. 6), in accordance with some embodiments.

The conductive layer 310 is made of an inductor material, in accordance with some embodiments. The inductor material includes metal (e.g., copper, aluminum, gold, silver, or tungsten), alloy thereof, nitrides (e.g., titanium nitride), or another suitable inductor material, in accordance with some embodiments.

As shown in FIGS. 3B-1 and 3B-2, a dielectric layer 320 is formed over the conductive layer 310 and the dielectric layer 150, in accordance with some embodiments. The dielectric layer 320 conformally covers the conductive layer 310, in accordance with some embodiments. In some embodiments, the dielectric layer 320 is a single-layered structure. In some other embodiments, the dielectric layer 320 is a multi-layered structure. The multi-layered structure has layers, and each layer is made of a material different from that of adjacent layer(s), in accordance with some embodiments.

The dielectric layer 320 is made of an insulating material, such as oxides (e.g., silicon oxide), nitrides (e.g., silicon nitride or silicon oxynitride), silicon carbide, un-doped silicate glass (USG), or a low-k dielectric material with a k-value lower than that of silicon oxide, in accordance with some embodiments. The dielectric layer 320 is formed using a deposition process, such as a chemical vapor deposition (CVD) process, a thermal atomic layer deposition (ALD) process, a plasma enhanced atomic layer deposition (PEALD) process, or another suitable deposition process.

As shown in FIGS. 3B-1 and 3B-2, a conductive layer 330 is formed over the dielectric layer 320, in accordance with some embodiments. The conductive layer 330 includes a conductive line 332, and the conductive line 332 has a spiral shape, in accordance with some embodiments. The conductive layer 330 is used as an inductor, in accordance with some embodiments.

The conductive line 332 has end portions 332a and 332b and a main portion 332c, in accordance with some embodiments. The end portions 332a and 332b are connected to the main portion 332c, in accordance with some embodiments. The end portion 332a or 332b is wider than the main portion 332c, in accordance with some embodiments. That is, a line width W5 of the end portion 332a or 332b is greater than a line width W6 of the main portion 332c, in accordance with some embodiments.

The conductive line 332 may have a round spiral shape (as shown in FIG. 3B-2), a square spiral shape (which is similar to that of the conductive line 312 of FIG. 4), a hexagonal spiral shape (which is similar to that of the conductive line 312 of FIG. 5), or an octagonal spiral shape (which is similar to that of the conductive line 312 of FIG. 6), in accordance with some embodiments.

The conductive layer 330 is made of an inductor material, in accordance with some embodiments. The inductor material includes metal (e.g., copper, aluminum, gold, silver, or tungsten), alloy thereof, nitrides (e.g., titanium nitride), or another suitable inductor material, in accordance with some embodiments.

As shown in FIGS. 3C-1 and 3C-2, a dielectric layer 340 is formed over the conductive layer 330 and the dielectric layer 320, in accordance with some embodiments. The dielectric layer 340 conformally covers the conductive layer 330 and the dielectric layer 320, in accordance with some embodiments.

In some embodiments, the dielectric layer 340 is a single-layered structure. In some other embodiments, the dielectric layer 340 is a multi-layered structure. The multi-layered structure has layers, and each layer is made of a material different from that of adjacent layer(s), in accordance with some embodiments.

The dielectric layer 340 is made of an insulating material, such as oxides (e.g., silicon oxide), nitrides (e.g., silicon nitride or silicon oxynitride), silicon carbide, un-doped silicate glass (USG), or a low-k dielectric material with a k-value lower than that of silicon oxide, in accordance with some embodiments.

The dielectric layer 340 is formed using a deposition process, such as a chemical vapor deposition (CVD) process, a thermal atomic layer deposition (ALD) process, a plasma enhanced atomic layer deposition (PEALD) process, or another suitable deposition process.

As shown in FIGS. 3C-1 and 3C-2, a conductive layer 350 is formed over the dielectric layer 340, in accordance with some embodiments. The conductive layer 350 includes a conductive line 352, and the conductive line 352 has a spiral shape, in accordance with some embodiments. The conductive layer 350 is used as an inductor, in accordance with some embodiments.

The conductive line 352 has end portions 352a and 352b and a main portion 352c, in accordance with some embodiments. The end portions 352a and 352b are connected to the main portion 352c, in accordance with some embodiments. The end portion 352a or 352b is wider than the main portion 352c, in accordance with some embodiments. That is, a line width W7 of the end portion 352a or 352b is greater than a line width W8 of the main portion 352c, in accordance with some embodiments.

The conductive line 352 may have a round spiral shape (as shown in FIG. 3C-2), a square spiral shape (which is similar to that of the conductive line 312 of FIG. 4), a hexagonal spiral shape (which is similar to that of the conductive line 312 of FIG. 5), or an octagonal spiral shape (which is similar to that of the conductive line 312 of FIG. 6), in accordance with some embodiments.

The conductive layer 350 is made of an inductor material, in accordance with some embodiments. The inductor material includes metal (e.g., copper, aluminum, gold, silver, or tungsten), alloy thereof, nitrides (e.g., titanium nitride), or another suitable inductor material, in accordance with some embodiments.

As shown in FIG. 3D-1, the step of FIG. 1D-1 is performed to form a dielectric layer 220 over the conductive layer 350 and the dielectric layer 340, in accordance with some embodiments. The dielectric layer 220 covers the entire conductive layer 350 and the entire dielectric layer 340, in accordance with some embodiments. For the sake of clarity, FIG. 3D-2 omits the dielectric layer 220, in accordance with some embodiments.

As shown in FIGS. 3D-1 and 3D-2, portions of the dielectric layer 220, the conductive layer 350, the dielectric layer 340, the conductive layer 330, the dielectric layer 320, the conductive layer 310, the dielectric layer 150, and the etch stop layer 140 are removed to form through holes 362 and 364, in accordance with some embodiments. The through holes 362 and 364 respectively expose the conductive lines 134c and 134d, in accordance with some embodiments.

The through hole 362 passes through the end portions 312a, 332a, and 352a, in accordance with some embodiments. The through hole 364 passes through the end portions 312b, 332b, and 352b, in accordance with some embodiments. The through holes 362 and 364 are formed using a photolithography process and an etching process, in accordance with some embodiments.

For the sake of clarity, FIG. 3E-2 omits the dielectric layer 220, in accordance with some embodiments. As shown in FIGS. 3E-1 and 3E-2, the step of FIG. 1F-1 is performed to form conductive structures 242 and 244, in accordance with some embodiments.

The conductive structures 242 and 244 are respectively formed in and over the through holes 362 and 364, in accordance with some embodiments. Each of the conductive structure 242 or 244 includes a seed layer 241a and a conductive layer 241b, in accordance with some embodiments. The conductive layer 241b is formed over the seed layer 241a, in accordance with some embodiments.

The conductive structure 242 includes a conductive via 242v and a conductive pad 242p, in accordance with some embodiments. The conductive via 242v is in the through hole 362, in accordance with some embodiments. The conductive via 242v passes through the end portions 312a, 332a, and 352a, in accordance with some embodiments. The conductive via 242v is electrically connected to the conductive layers 310, 330, and 350, in accordance with some embodiments. The conductive pad 242p is over and in direct contact with the conductive via 242v, in accordance with some embodiments.

The conductive structure 244 includes a conductive via 244v and a conductive pad 244p, in accordance with some embodiments. The conductive via 244v is in the through hole 364, in accordance with some embodiments. The conductive via 244v passes through the end portions 312b, 332b, and 352b, in accordance with some embodiments.

The conductive via 244v is electrically connected to the conductive layers 310, 330, and 350, in accordance with some embodiments. The conductive pad 244p is over and in direct contact with the conductive via 244v, in accordance with some embodiments.

In some embodiments, the conductive layer 310 is a first inductor, the conductive layer 330 is a second inductor, and the conductive layer 350 is a third inductor. The first inductor, the second inductor and the third inductor are electrically connected in parallel with each other via the conductive structures 242 and 244, in accordance with some embodiments.

As shown in FIG. 3F-1, the steps of FIGS. 1G-1 and 1H-1 are performed to form a dielectric layer 250, a protective layer 260, bump structures 270, and solder balls 290, in accordance with some embodiments. The dielectric layer 250 is formed over the conductive structures 242 and 244 and the dielectric layer 220, in accordance with some embodiments. The dielectric layer 250 has openings 252 and 254, in accordance with some embodiments. The openings 252 and 254 respectively expose the conductive structures 242 and 244, in accordance with some embodiments.

The protective layer 260 is formed over the dielectric layer 250, in accordance with some embodiments. The protective layer 260 is used to protect the dielectric layer 250 from damage or being affected by moisture, in accordance with some embodiments. The protective layer 260 has openings 262 and 264, in accordance with some embodiments. The openings 262 and 264 respectively expose the conductive structures 242 and 244, in accordance with some embodiments.

The bump structures 270 are respectively in the openings 262 and 264, in accordance with some embodiments. Each bump structure 270 includes a seed layer 272 and a conductive layer 274, in accordance with some embodiments. The conductive layer 274 is over the seed layer 272, in accordance with some embodiments. The solder balls 290 are respectively over the bump structures 270, in accordance with some embodiments. In this step, a chip structure 300 is substantially formed, in accordance with some embodiments. The width W1 of the conductive via 242v or 244v is greater than the width W2 of the conductive via 126 of the interconnect structure 120, in accordance with some embodiments.

Since the first inductor, the second inductor, and the third inductor are integrated into the chip structure 300, the conductive path between the device elements, which are formed at the surface 112 of the substrate 110, and the first, second and third inductors is greatly reduced, in accordance with some embodiments. Therefore, the resistance of aforementioned conductive path is greatly reduced, in accordance with some embodiments.

Furthermore, since the conductive via 242v or 244v is wider than the conductive via 126 of the interconnect structure 120, the contact area between the conductive via 242v or 244v and the first, second and third inductors is larger than the contact area between the conductive via 126 and an inductor (not shown) formed in the interconnect structure 120. Therefore, the resistance between the conductive via 242v or 244v and the first, second and third inductors is reduced, in accordance with some embodiments.

Figures 1, 7A:
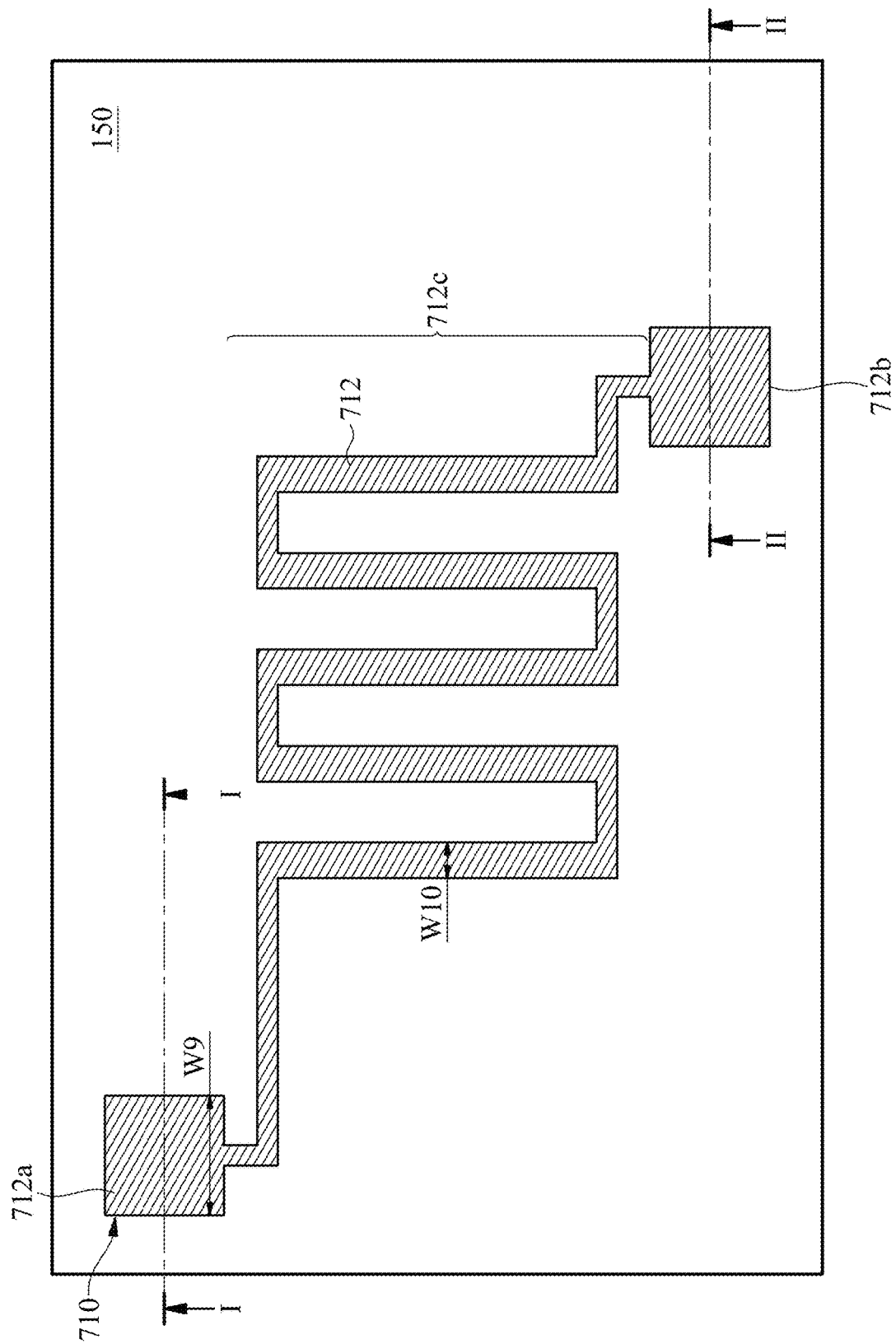
Figures 1, 7B:
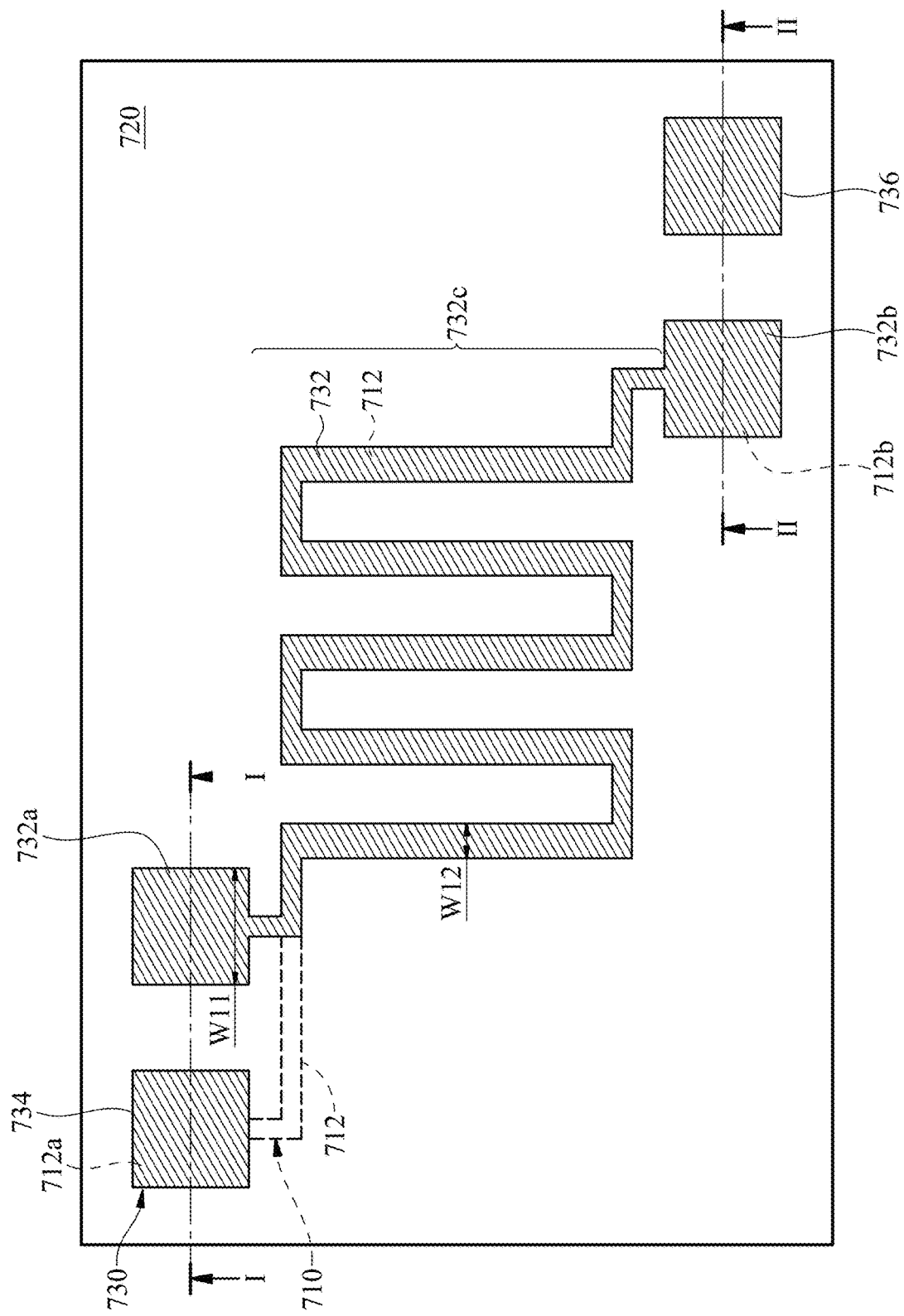
Figures 3, 7B:
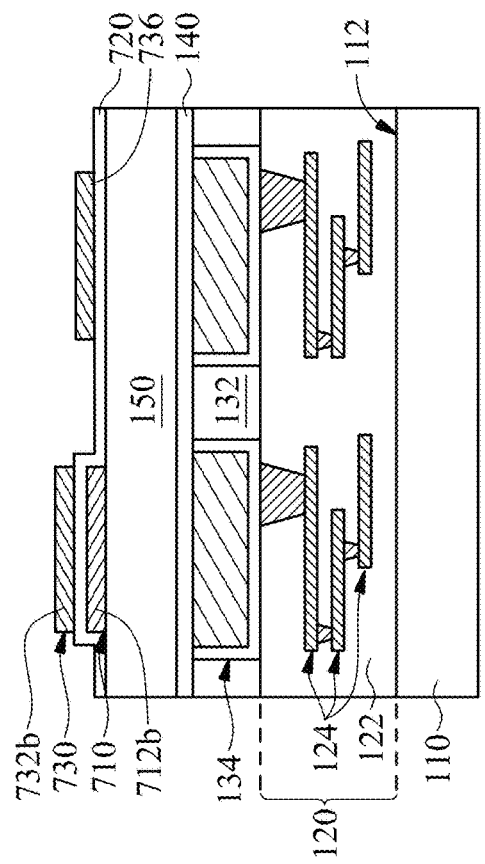
Figures 2, 7B:
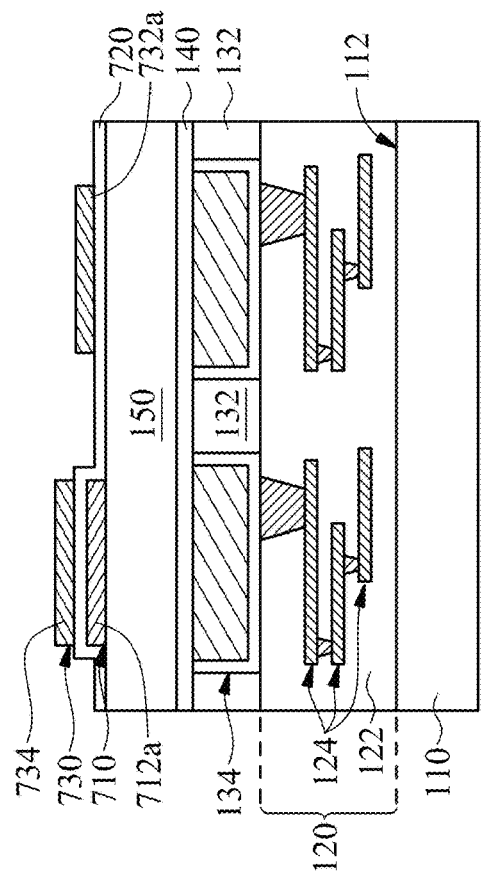
Figures 1, 7C:
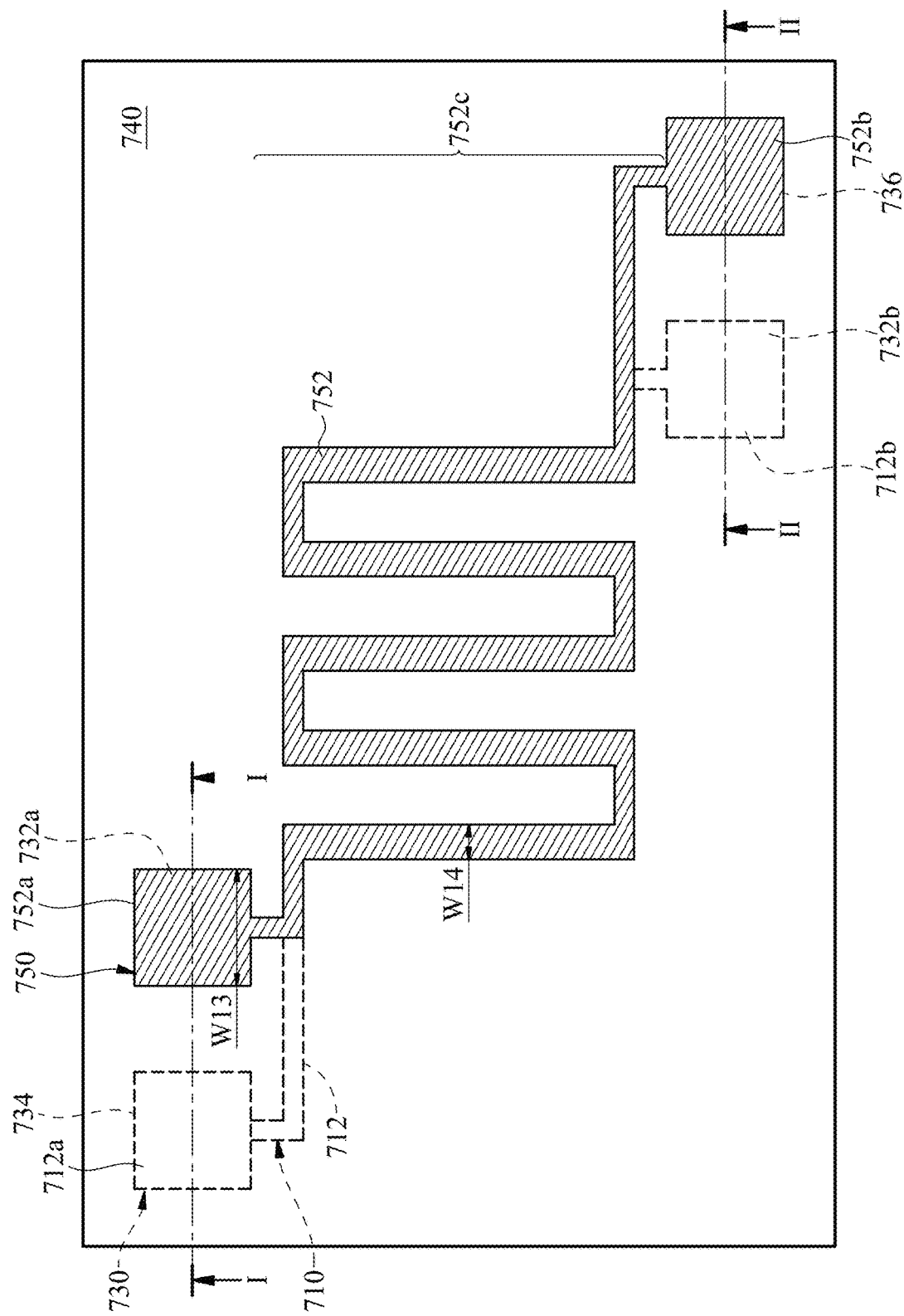
Figures 2, 7C:
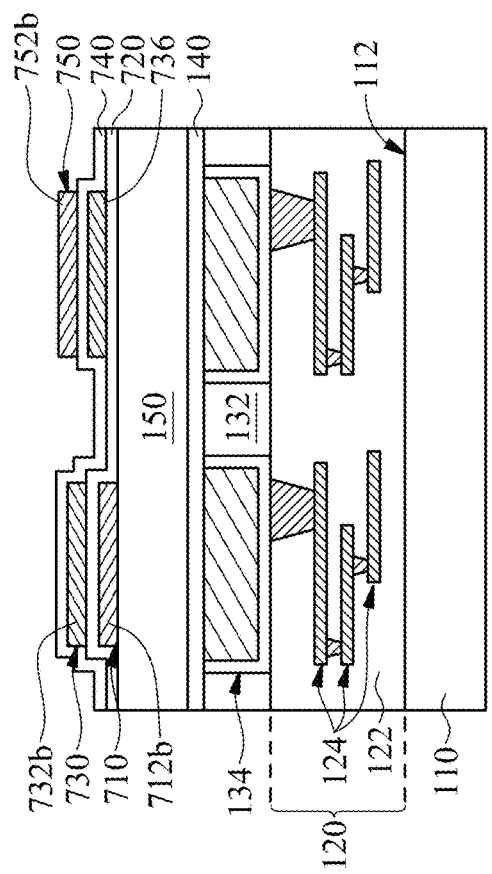
Figures 3, 7C:
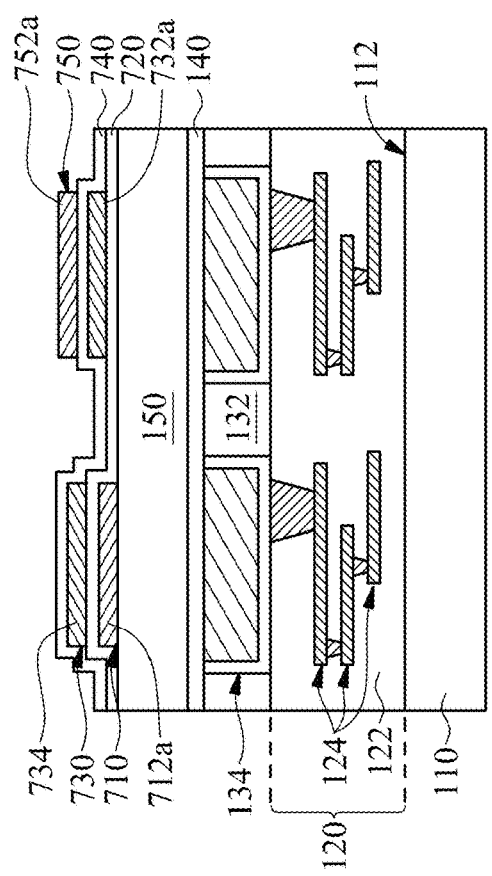
Figures 1, 7D:
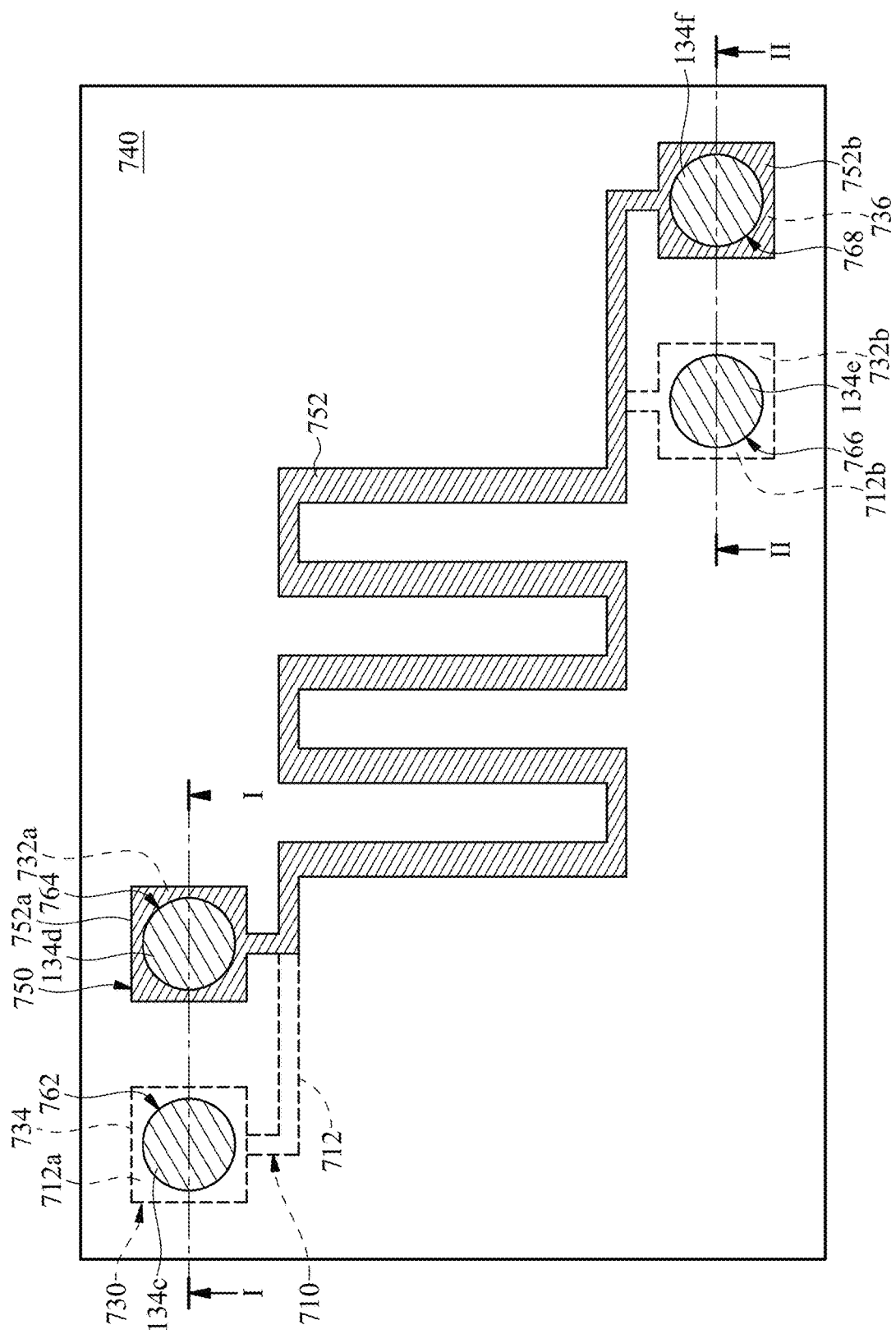
Figures 1, 7E:
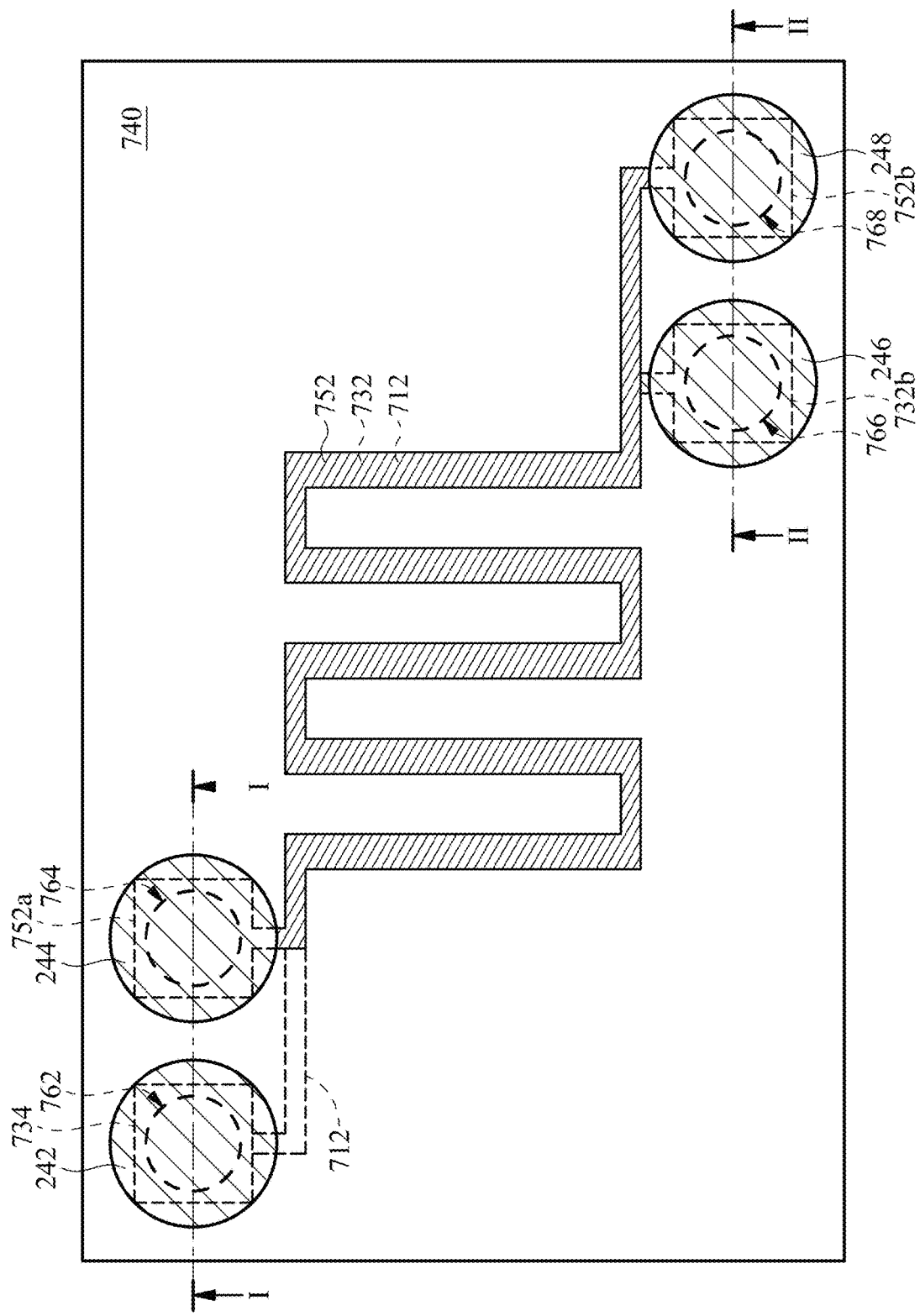
Figures 2, 3, 7E:
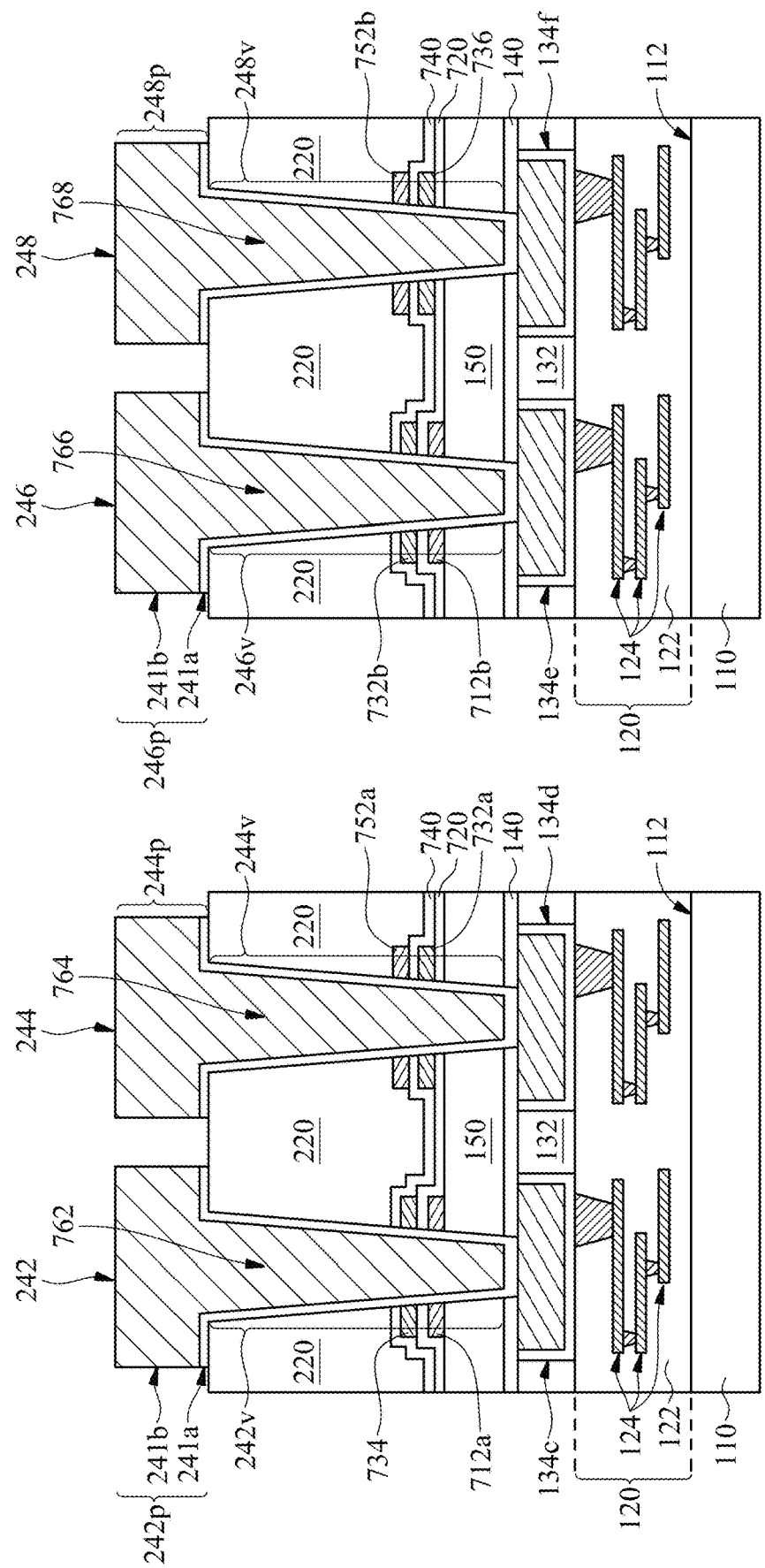
Figures 1, 7F:
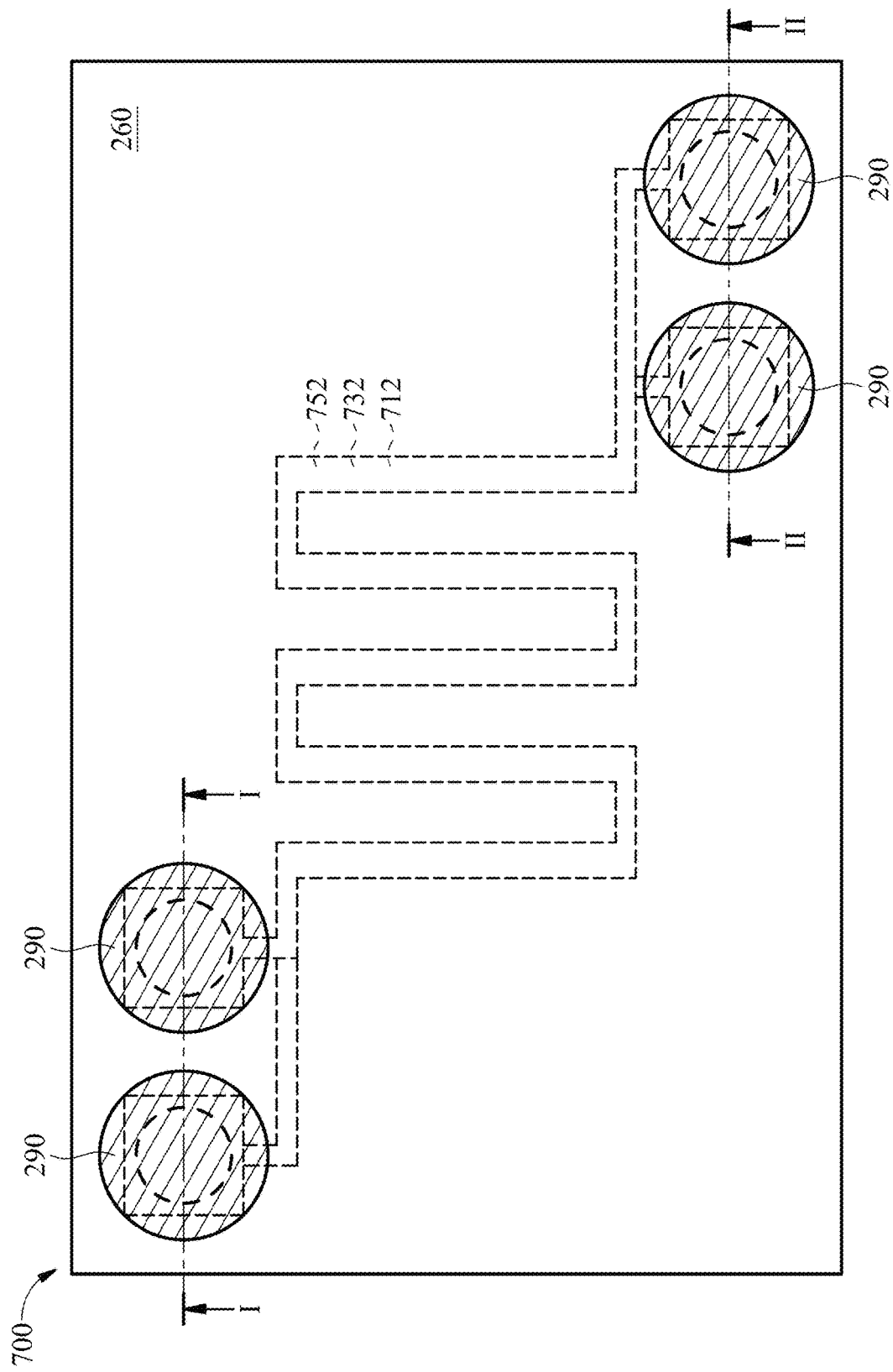

FIG. 7A-1 to FIG. 7F-1 are top views of various stages of a process for forming a chip structure, in accordance with some embodiments. FIG. 7A-2 to FIG. 7F-2 are cross-sectional views illustrating the chip structure along a sectional line I-I in FIG. 7A-1 to FIG. 7F-1, in accordance with some embodiments. FIG. 7A-3 to FIG. 7F-3 are cross-sectional views illustrating the chip structure along a sectional line II-II in FIG. 7A-1 to FIG. 7F-1, in accordance with some embodiments.

As shown in FIGS. 7A-1, 7A-2, and 7A-3, a step similar to the step of FIG. 1A-1 is performed to form a substrate 110, an interconnect structure 120, a dielectric layer 132, a wiring layer 134, an etch stop layer 140, a dielectric layer 150, and a conductive layer 710, in accordance with some embodiments. The wiring layer 134 includes conductive lines 134c, 134d, 134e, and 134f, in accordance with some embodiments.

The step of FIGS. 7A-1, 7A-2, and 7A-3 is similar to the FIGS. 1A-1 and 1A-2, except that in comparison with the conductive layer 160 formed in the step of FIGS. 1A-1 and 1A-2, the conductive layer 710 formed in the step of FIGS. 7A-1, 7A-2, and 7A-3 includes a conductive line 712, in accordance with some embodiments. The conductive line 712 has a wavy shape (or a meander shape), in accordance with some embodiments. The conductive line 712 is used as a resistor, in accordance with some embodiments.

The conductive line 712 has end portions 712a and 712b and a main portion 712c, in accordance with some embodiments. The end portions 712a and 712b are connected to the main portion 712c, in accordance with some embodiments. The end portion 712a or 712b is wider than the main portion 712c, in accordance with some embodiments. That is, a line width W9 of the end portion 712a or 712b is greater than a line width W10 of the main portion 712c, in accordance with some embodiments.

The conductive layer 710 is made of a resistor material, in accordance with some embodiments. The resistor material includes semiconductor (e.g., polysilicon), nitrides (e.g., titanium nitride), metal (e.g., tantalum), alloy (e.g., nichrome) or another suitable resistor material, in accordance with some embodiments. In some embodiments, the resistance of the resistor material is higher than that of the materials of the wiring layers 124 and 134 or the conductive vias 126.

In some other embodiments, the conductive layer 710 and the wiring layers 124 and 134 (or the conductive vias 126) are made of the same material (e.g., copper, aluminum, gold, silver, tungsten, alloys thereof), and the resistance of the conductive layer 710 may be adjusted by adjusting the shape or the size (e.g., the length) of the conductive line 712, in accordance with some embodiments.

As shown in FIGS. 7B-1, 7B-2, and 7B-3, a dielectric layer 720 is formed over the conductive layer 710 and the dielectric layer 150, in accordance with some embodiments. The dielectric layer 720 covers the entire conductive layer 710 and the entire dielectric layer 150, in accordance with some embodiments.

The dielectric layer 720 conformally covers the conductive layer 710 and the dielectric layer 150, in accordance with some embodiments. In some embodiments, the dielectric layer 720 is a single-layered structure. In some other embodiments, the dielectric layer 720 is a multi-layered structure. The multi-layered structure has layers, and each layer is made of a material different from that of adjacent layer(s), in accordance with some embodiments.

The dielectric layer 720 is made of an insulating material, such as oxides (e.g., silicon oxide), nitrides (e.g., silicon nitride or silicon oxynitride), silicon carbide, un-doped silicate glass (USG), or a low-k dielectric material with a k-value lower than that of silicon oxide, in accordance with some embodiments.

The dielectric layer 720 is formed using a deposition process, such as a chemical vapor deposition (CVD) process, a thermal atomic layer deposition (ALD) process, a plasma enhanced atomic layer deposition (PEALD) process, or another suitable deposition process.

As shown in FIGS. 7B-1, 7B-2, and 7B-3, a conductive layer 730 is formed over the dielectric layer 720, in accordance with some embodiments. The conductive layer 730 includes a conductive line 732 and dummy films 734 and 736, in accordance with some embodiments. The conductive line 732 has a wavy shape (or a meander shape), in accordance with some embodiments. The conductive line 732 is used as a resistor, in accordance with some embodiments.

The conductive line 732 has end portions 732a and 732b and a main portion 732c, in accordance with some embodiments. The end portions 732a and 732b are connected to the main portion 732c, in accordance with some embodiments. The end portion 732a or 732b is wider than the main portion 732c, in accordance with some embodiments. That is, a line width W11 of the end portion 732a or 732b is greater than a line width W12 of the main portion 732c, in accordance with some embodiments. The dummy film 734 overlaps the end portion 712a, in accordance with some embodiments.

The end portion 732b overlaps the end portion 712b, in accordance with some embodiments.

The conductive layer 730 is made of a resistor material, in accordance with some embodiments. The resistor material includes semiconductor (e.g., polysilicon), nitrides (e.g., titanium nitride), metal (e.g., tantalum), alloy (e.g., nichrome), or another suitable resistor material, in accordance with some embodiments. In some embodiments, the resistance of the resistor material is higher than that of the materials of the wiring layers 124 and 134 or the conductive vias 126.

In some other embodiments, the conductive layer 730 and the wiring layers 124 and 134 (or the conductive vias 126) are made of the same material (e.g., copper, aluminum, gold, silver, tungsten, alloys thereof), and the resistance of the conductive layer 730 may be adjusted by adjusting the shape or the size (e.g., the length) of the conductive line 732, in accordance with some embodiments.

As shown in FIGS. 7C-1, 7C-2, and 7C-3, a dielectric layer 740 is formed over the conductive layer 730 and the dielectric layer 720, in accordance with some embodiments. The dielectric layer 740 covers the entire conductive layer 730 and the entire dielectric layer 720, in accordance with some embodiments.

The dielectric layer 740 conformally covers the conductive layer 730 and the dielectric layer 720, in accordance with some embodiments. In some embodiments, the dielectric layer 740 is a single-layered structure. In some other embodiments, the dielectric layer 740 is a multi-layered structure. The multi-layered structure has layers, and each layer is made of a material different from that of adjacent layer(s), in accordance with some embodiments.

The dielectric layer 740 is made of an insulating material, such as oxides (e.g., silicon oxide), nitrides (e.g., silicon nitride or silicon oxynitride), silicon carbide, un-doped silicate glass (USG), or a low-k dielectric material with a k-value lower than that of silicon oxide, in accordance with some embodiments. The dielectric layer 740 is formed using a deposition process, such as a chemical vapor deposition (CVD) process, a thermal atomic layer deposition (ALD) process, a plasma enhanced atomic layer deposition (PEALD) process, or another suitable deposition process.

As shown in FIGS. 7C-1, 7C-2, and 7C-3, a conductive layer 750 is formed over the dielectric layer 740, in accordance with some embodiments. The conductive layer 750 includes a conductive line 752, in accordance with some embodiments. The conductive line 752 has a wavy shape (or a meander shape), in accordance with some embodiments. The conductive line 752 is used as a resistor, in accordance with some embodiments.

The conductive line 752 has end portions 752a and 752b and a main portion 752c, in accordance with some embodiments. The end portions 752a and 752b are connected to the main portion 752c, in accordance with some embodiments. The end portion 752a or 752b is wider than the main portion 752c, in accordance with some embodiments. That is, a line width W13 of the end portion 752a or 752b is greater than a line width W14 of the main portion 752c, in accordance with some embodiments.

The conductive layer 750 is made of a resistor material, in accordance with some embodiments. The resistor material includes semiconductor (e.g., polysilicon), nitrides (e.g., titanium nitride), metal (e.g., tantalum), alloy (e.g., nichrome), or another suitable resistor material, in accordance with some embodiments. In some embodiments, the resistance of the resistor material is higher than that of the materials of the wiring layers 124 and 134 or the conductive vias 126.

In some other embodiments, the conductive layer 750 and the wiring layers 124 and 134 (or the conductive vias 126) are made of the same material (e.g., copper, aluminum, gold, silver, tungsten, alloys thereof), and the resistance of the conductive layer 750 may be adjusted by adjusting the shape or the size (e.g., the length) of the conductive line 752, in accordance with some embodiments.

As shown in FIGS. 7D-1, 7D-2, and 7D-3, the step of FIG. 1D-1 is performed to form a dielectric layer 220 over the conductive layer 750 and the dielectric layer 740, in accordance with some embodiments. For the sake of clarity, FIG. 7D-1 omits the dielectric layer 220, in accordance with some embodiments.

As shown in FIGS. 7D-1, 7D-2 and 7D-3, portions of the dielectric layer 220, the conductive layer 750, the dielectric layer 740, the conductive layer 730, the dielectric layer 720, the conductive layer 710, the dielectric layer 150, and the etch stop layer 140 are removed to form through holes 762, 764, 766 and 768, in accordance with some embodiments. The through holes 762, 764, 766 and 768 respectively expose the conductive lines 134c, 134d, 134e and 134f, in accordance with some embodiments.

The through hole 762 passes through the end portion 712a and the dummy film 734, in accordance with some embodiments. The through hole 764 passes through the end portions 732a and 752a, in accordance with some embodiments. The through hole 766 passes through the end portions 712b and 732b, in accordance with some embodiments.

The through hole 768 passes through the end portion 752b and the dummy film 736, in accordance with some embodiments. The through holes 762, 764, 766 and 768 are formed using a photolithography process and an etching process, in accordance with some embodiments.

For the sake of clarity, FIG. 7E-1 omits the dielectric layer 220, in accordance with some embodiments. As shown in FIGS. 7E-1, 7E-2, and 7E-3, the step of FIG. 1F-1 is performed to form conductive structures 242, 244, 246 and 248, in accordance with some embodiments.

The conductive structures 242, 244, 246 and 248 are respectively formed in and over the through holes 762, 764, 766 and 768, in accordance with some embodiments. Each of the conductive structure 242, 244, 246 or 248 includes a seed layer 241a and a conductive layer 241b, in accordance with some embodiments. The conductive layer 241b is formed over the seed layer 241a, in accordance with some embodiments.

The conductive structure 242 includes a conductive via 242v and a conductive pad 242p, in accordance with some embodiments. The conductive via 242v is in the through hole 762, in accordance with some embodiments. The conductive via 242v passes through the end portion 712a and the dummy film 734, in accordance with some embodiments. The conductive via 242v is electrically connected to the conductive line 712, in accordance with some embodiments. The conductive pad 242p is over and in direct contact with the conductive via 242v, in accordance with some embodiments.

The conductive structure 244 includes a conductive via 244v and a conductive pad 244p, in accordance with some embodiments. The conductive via 244v is in the through hole 764, in accordance with some embodiments. The conductive via 244v passes through the end portions 732a and 752a, in accordance with some embodiments. The conductive via 244v is electrically connected to the conductive lines 732 and 752, in accordance with some embodiments. The conductive pad 244p is over and in direct contact with the conductive via 244v, in accordance with some embodiments.

The conductive structure 246 includes a conductive via 246v and a conductive pad 246p, in accordance with some embodiments. The conductive via 246v is in the through hole 766, in accordance with some embodiments. The conductive via 246v passes through the end portions 712b and 732b, in accordance with some embodiments. The conductive via 246v is electrically connected to the conductive lines 712 and 732, in accordance with some embodiments. The conductive pad 246p is over and in direct contact with the conductive via 246v, in accordance with some embodiments.

The conductive structure 248 includes a conductive via 248v and a conductive pad 248p, in accordance with some embodiments. The conductive via 248v is in the through hole 768, in accordance with some embodiments. The conductive via 248v passes through the end portion 752b and the dummy film 736, in accordance with some embodiments. The conductive via 248v is electrically connected to the conductive line 752, in accordance with some embodiments. The conductive pad 248p is over and in direct contact with the conductive via 248v, in accordance with some embodiments.

In some embodiments, the conductive line 712 is a first resistor, the conductive line 732 is a second resistor, and the conductive line 752 is a third resistor. The first resistor, the second resistor and the third resistor are electrically connected in series with each other via the conductive structures 242, 244, 246 and 248, in accordance with some embodiments.

In some embodiments, a current flows from the conductive structure 242 to the conductive structure 248 sequentially through the conductive line 712 (including the end portion 712a, the main portion 712c, and the end portion 712b), the conductive structure 246, the conductive line 732 (including the end portion 732b, the main portion 732c, and the end portion 732a), the conductive structure 244, and the conductive line 752 (including the end portion 752a, the main portion 752c, and the end portion 752b), in accordance with some embodiments.

As shown in FIGS. 7F-1, 7F-2, and 7F-3, the steps of FIGS. 1G-1 and 1H-1 are performed to form a dielectric layer 250, a protective layer 260, bump structures 270, and solder balls 290, in accordance with some embodiments. The dielectric layer 250 is formed over the conductive structures 242, 244, 246 and 248 and the dielectric layer 220, in accordance with some embodiments. The dielectric layer 250 has openings 252, 254, 256 and 258, in accordance with some embodiments. The openings 252, 254, 256 and 258 respectively expose the conductive structures 242, 244, 246 and 248, in accordance with some embodiments.

The protective layer 260 is formed over the dielectric layer 250, in accordance with some embodiments. The protective layer 260 is used to protect the dielectric layer 250 from damage or being affected by moisture, in accordance with some embodiments. The protective layer 260 has openings 262, 264, 266 and 268, in accordance with some embodiments. The openings 262, 264, 266 and 268 respectively expose the conductive structures 242, 244, 246 and 248, in accordance with some embodiments.

The bump structures 270 are respectively formed in the openings 262, 264, 266 and 268, in accordance with some embodiments. Each bump structure 270 includes a seed layer 272 and a conductive layer 274, in accordance with some embodiments. The conductive layer 274 is over the seed layer 272, in accordance with some embodiments. The solder balls 290 are respectively over the bump structures 270, in accordance with some embodiments. In this step, a chip structure 700 is substantially formed, in accordance with some embodiments.

Since the first resistor, the second resistor, and the third resistor are integrated into the chip structure 700, the conductive path between the device elements, which are formed at the surface 112 of the substrate 110, and the first, second and third resistors may be precisely controlled which may prevent undesired resistance, in accordance with some embodiments. Therefore, the performance of the chip structure 700 is improved, in accordance with some embodiments.

The thickness of the conductive layer 310, 330, 350, 710, 730 or 750 (as shown in FIGS. 3F-1 and 7F-2) is substantially similar to or the same as that of the conductive layer 160 (as shown in FIG. 1H-1), in accordance with some embodiments. The thickness of the dielectric layer 320, 340, 720 or 740 (as shown in FIGS. 3F-1 and 7F-2) is substantially similar to or the same as that of the dielectric layer 170 or 190 (as shown in FIG. 1H-1), in accordance with some embodiments.

Processes and materials for forming the chip structures 200, 300 and 700 may be similar to, or the same as, those for forming the chip structure 100 described above.

In accordance with some embodiments, chip structures and methods for forming the same are provided. The methods (for forming the chip structure) form a passive device between a conductive pad and a top metal layer of a chip structure, in accordance with some embodiments. The passive device is electrically connected to a conductive via between the conductive pad and the top metal layer, in accordance with some embodiments. Since the passive device is integrated into the chip structure, the conductive path between the passive device and device elements formed in the chip structure is reduced, which reduces the resistance of the conductive path. Therefore, the performance of the chip structure is improved.

In accordance with some embodiments, a method for forming a chip structure is provided. The method includes providing a semiconductor substrate, a first conductive line, and a first dielectric layer. The first conductive line is over the semiconductor substrate, and the first dielectric layer is over the first conductive line and the semiconductor substrate. The method includes forming a first conductive layer over the first dielectric layer. The first conductive layer is thinner than the first conductive line. The method includes forming a second conductive layer over the first conductive layer. The first conductive layer and the second conductive layer are electrically insulated from each other. The method includes forming a second dielectric layer over the second conductive layer and the first conductive layer. The method includes forming a first through hole passing through the second dielectric layer, the first conductive layer, and the first dielectric layer. The method includes forming a first conductive structure in and over the first through hole. The first conductive structure includes a first conductive via and a first conductive pad, the first conductive via is in the first through hole and electrically connected to the first conductive layer and the first conductive line, and the first conductive pad is over and in direct contact with the first conductive via.

In accordance with some embodiments, a method for forming a chip structure is provided. The method includes providing a semiconductor substrate, a first conductive line, and a first dielectric layer. The first conductive line is over the semiconductor substrate, and the first dielectric layer is over the first conductive line and the semiconductor substrate. The method includes forming a second conductive line over the first dielectric layer. The second conductive line is thinner than the first conductive line, and the second conductive line has a spiral shape. The method includes forming a second dielectric layer over the second conductive line and the first dielectric layer. The method includes forming a first through hole passing through the second dielectric layer, the second conductive line, and the first dielectric layer. The method includes forming a first conductive structure in and over the first through hole. The first conductive structure includes a first conductive via and a first conductive pad, the first conductive via is in the first through hole and electrically connected to the second conductive line and the first conductive line, and the first conductive pad is over and connected to the first conductive via.

In accordance with some embodiments, a method for forming a chip structure is provided. The method includes providing a semiconductor substrate, a first conductive line, and a first dielectric layer. The first conductive line is over the semiconductor substrate, and the first dielectric layer is over the first conductive line and the semiconductor substrate. The method includes forming a conductive layer over the first dielectric layer. The method includes forming a second dielectric layer over the conductive layer and the first dielectric layer. The method includes forming a first through hole passing through the second dielectric layer, the conductive layer, and the first dielectric layer. The method includes forming a first conductive structure in and over the first through hole. The first conductive structure includes a first conductive via and a first conductive pad, the first conductive via is in the first through hole and electrically connected to the conductive layer and the first conductive line, the first conductive pad is over the first conductive via, the conductive layer is made of a first material having a first resistance, and the first resistance is higher than a second resistance of a second material of the first conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip structure, comprising:
   a semiconductor substrate;
   a first conductive layer over the semiconductor substrate;
   a conductive via passing through the first conductive layer and electrically connected to the first conductive layer;
   a conductive pad over and in direct contact with the conductive via;
   a second conductive layer over and spaced apart from the first conductive layer, wherein a first lower portion of the second conductive layer is embedded in the first conductive layer, the first lower portion is a single continuous portion, and the conductive via penetrates into and through the second conductive layer and is electrically insulated from the second conductive layer;
   a first dielectric layer conformally covering a second lower portion of a sidewall of the second conductive layer, wherein the first dielectric layer is in direct contact with the second lower portion of the sidewall, and the first dielectric layer is a single layer structure; and
   a third conductive layer over the first dielectric layer, wherein the first dielectric layer is in direct contact with the third conductive layer, the conductive via is electrically connected to the third conductive layer, the third conductive layer has a top surface, a first upper surface, a second upper surface, a first sidewall, a second sidewall, and a third sidewall, the first upper surface is lower than the top surface and higher than the second upper surface,
   wherein the top surface, the first upper surface, and the second upper surface face away from the semiconductor substrate, the first sidewall is connected between the top surface and the first upper surface, the second sidewall is connected between the first upper surface and the second upper surface, the third sidewall is connected to the second upper surface, the third conductive layer has a first corner, a second corner, and a third corner, the first corner is between the top surface and the first sidewall, the second corner is between the first upper surface and the second sidewall, the third corner is between the second upper surface and the third sidewall, and the first corner is between the second corner and the conductive via.

2. The chip structure as claimed in claim 1, further comprising:
   a wiring layer between the semiconductor substrate and the first conductive layer, wherein the wiring layer comprises a conductive line, and the conductive via is over and electrically connected to the first conductive line.

3. The chip structure as claimed in claim 2, wherein the first conductive layer is thinner than the conductive line.

4. The chip structure as claimed in claim 2, wherein the first conductive layer is thinner than the conductive pad.

5. The chip structure as claimed in claim 1, further comprising:
   a second dielectric layer over the first conductive layer, wherein the second conductive layer is over the second dielectric layer, the second dielectric layer separates the first conductive layer from the second conductive layer, and the conductive via further passes through the second dielectric layer.

6. The chip structure as claimed in claim 5, wherein the second dielectric layer is thinner than the first conductive layer.

7. A chip structure, comprising:
   a semiconductor substrate;
   a conductive line over the semiconductor substrate;
   a first conductive layer over the conductive line, wherein the first conductive layer is thinner than the conductive line, and the first conductive layer has an inner wall and a top surface;
   a first dielectric layer conformally covering a first lower portion of the inner wall of the first conductive layer, wherein the first dielectric layer is formed of a first single continuous dielectric film;
   a second conductive layer over the first dielectric layer;
   a second dielectric layer conformally covering a second lower portion of a sidewall of the second conductive layer, wherein the second dielectric layer is formed of a second single continuous dielectric film, and the second dielectric layer is in direct contact with the first dielectric layer;

a third conductive layer over the second dielectric layer and having a conductive film, a first dummy film, and a second dummy film, wherein the conductive film, the first dummy film, the second dummy film are spaced apart and electrically insulated from each other, and a portion of the conductive film is between the first dummy film and the second dummy film;

a conductive via passing through the first conductive layer, the second conductive layer, and the conductive film of the third conductive layer and electrically connected to the first conductive layer, the conductive film of the third conductive layer, and the conductive line and electrically insulated from the second conductive layer; and a conductive pad over and in direct contact with the conductive via.

8. The chip structure as claimed in claim 7, wherein the first dummy film, the second dummy film, and the conductive film are made of a same conductive material.

9. The chip structure as claimed in claim 7, further comprising:

a bump structure over and in direct contact with the conductive pad.

10. The chip structure as claimed in claim 7, wherein the first dielectric layer is thinner than the first conductive layer.

11. A chip structure, comprising:
a semiconductor substrate;
a first capacitor electrode over the semiconductor substrate and having an inner wall;
a second capacitor electrode over the first capacitor electrode, wherein the second capacitor electrode is spaced apart from the first capacitor electrode, the inner wall of the first capacitor electrode laterally and continuously surrounds an entirety of a lower portion of the second capacitor electrode, and the lower portion is a single continuous portion;
a conductive structure passing through the second capacitor electrode and electrically connected to the second capacitor electrode;
a bump structure over and in direct contact with the conductive structure; and
a dummy conductive film over the semiconductor substrate and laterally and entirely surrounded by the inner wall of the first capacitor electrode, wherein the second capacitor electrode covers the dummy conductive film, the dummy conductive film is embedded in the second capacitor electrode, the conductive structure further penetrates into and through the dummy conductive film, a first bottom surface of the first capacitor electrode is substantially level with a second bottom surface of the dummy conductive film, and the first bottom surface and the second bottom surface face the semiconductor substrate.

12. The chip structure as claimed in claim 11, wherein the conductive structure is in direct contact with the second capacitor electrode.

13. The chip structure as claimed in claim 12, wherein the conductive structure is in direct contact with the dummy conductive film.

14. The chip structure as claimed in claim 11, wherein the lower portion of the second capacitor electrode has a U-like shape.

15. The chip structure as claimed in claim 11, wherein the dummy conductive film and the first capacitor electrode are made of a same material.

16. The chip structure as claimed in claim 11, further comprising:

a dielectric layer conformally and continuously covering a first top surface and the inner wall of the first capacitor electrode and a second top surface and a sidewall of the dummy conductive film, wherein the second capacitor electrode conformally and continuously covers the dielectric layer.

17. The chip structure as claimed in claim 11, wherein the conductive structure is electrically connected to the dummy conductive film.

18. The chip structure as claimed in claim 1, wherein a first distance between the first corner and the conductive via is less than a second distance between the second corner and the conductive via, and the second distance is less than a third distance between the third corner and the conductive via.

19. The chip structure as claimed in claim 7, wherein the conductive film surrounds the entire first dummy film and is located on one side of the second dummy film.

20. The chip structure as claimed in claim 11, wherein the dummy conductive film is between the semiconductor substrate and the second capacitor electrode.

* * * * *